United States Patent
Wang et al.

(10) Patent No.: US 12,451,442 B2
(45) Date of Patent: Oct. 21, 2025

(54) METHODS OF FORMING MICROELECTRONIC DEVICES INCLUDING SUPPORT CONTACT STRUCTURES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Yiping Wang, Boise, ID (US); Sandra L. Tagg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 717 days.

(21) Appl. No.: 17/805,009

(22) Filed: Jun. 1, 2022

(65) Prior Publication Data

US 2023/0395525 A1    Dec. 7, 2023

(51) Int. Cl.
| | |
|---|---|
| *H01L 23/00* | (2006.01) |
| *H01L 23/535* | (2006.01) |
| *H10B 41/27* | (2023.01) |
| *H10B 43/27* | (2023.01) |

(52) U.S. Cl.
CPC .......... *H01L 23/562* (2013.01); *H01L 23/535* (2013.01); *H10B 41/27* (2023.02); *H10B 43/27* (2023.02)

(58) Field of Classification Search
CPC ........ H10B 41/27; H10B 43/27; H10B 41/40; H10B 43/40
See application file for complete search history.

(56) References Cited

U.S. PATENT DOCUMENTS

2022/0199637 A1\*  6/2022  Luo ........................ H10B 43/50

\* cited by examiner

*Primary Examiner* — Marlon T Fletcher
*Assistant Examiner* — Samuel Jonathan Smith
(74) *Attorney, Agent, or Firm* — TraskBritt

(57) ABSTRACT

Methods of forming a microelectronic device includes forming a preliminary stack structure including blocks separated by slots, each block including: tiers each including insulative material and sacrificial material; and live contact openings and support contact openings extending completely through the tiers. A first liner and a second liner are formed over surfaces of the preliminary stack structure. Portions of the second liner and the first liner within the support contact openings are removed without removing additional portions of the second liner and the first liner within the slots and the live contact openings. Fill material is formed within the slots, the live contact openings, and the support contact openings to form sacrificial slot structures, sacrificial contact structures, and support contact structures. The sacrificial contact structures are replaced with conductive contact structures. The sacrificial slot structures are removed, and the sacrificial material of the tiers is replaced with conductive material.

13 Claims, 17 Drawing Sheets

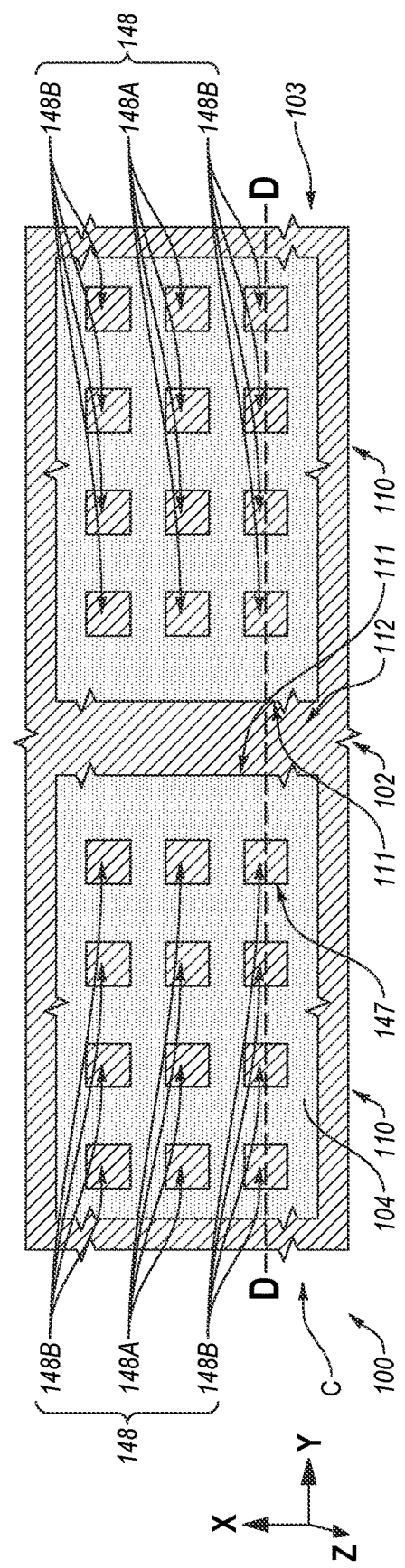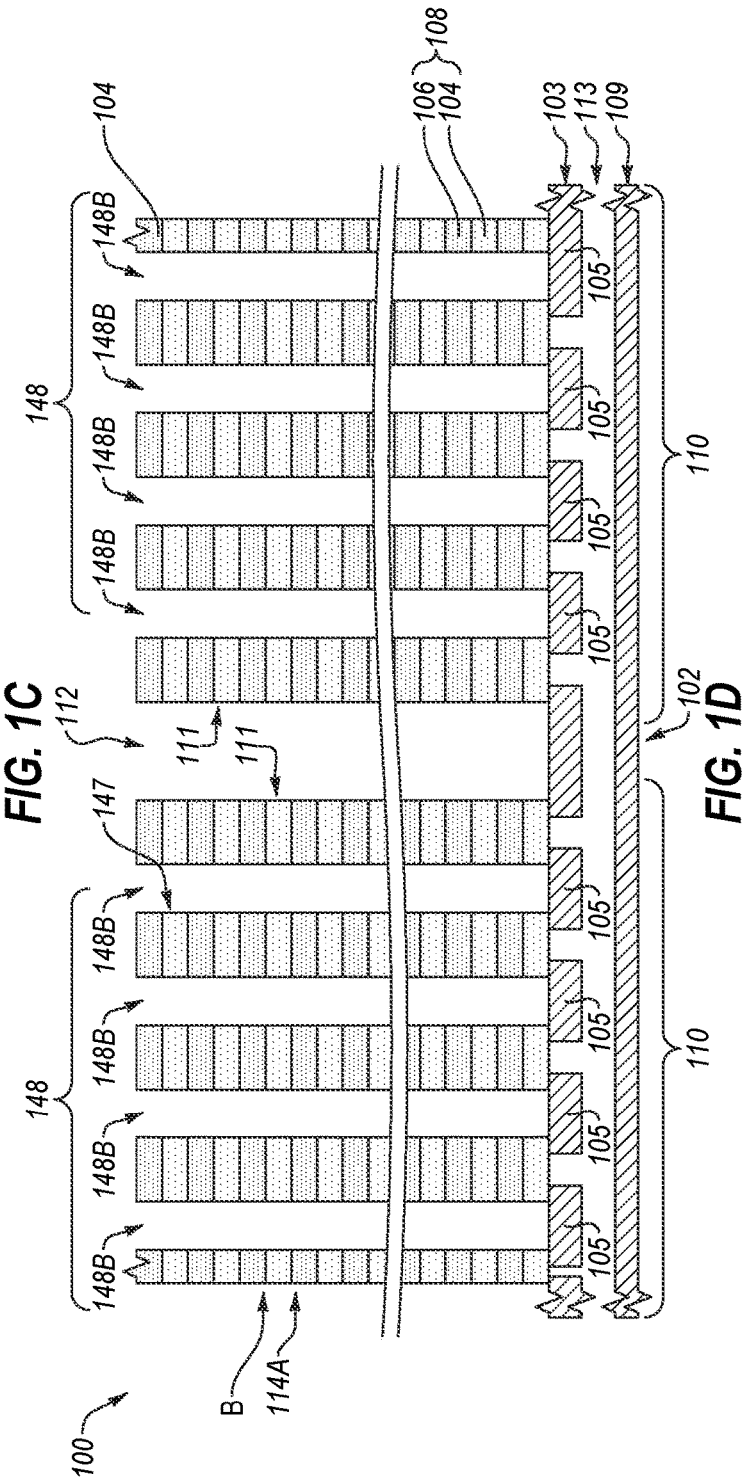
FIG. 1C
FIG. 1D

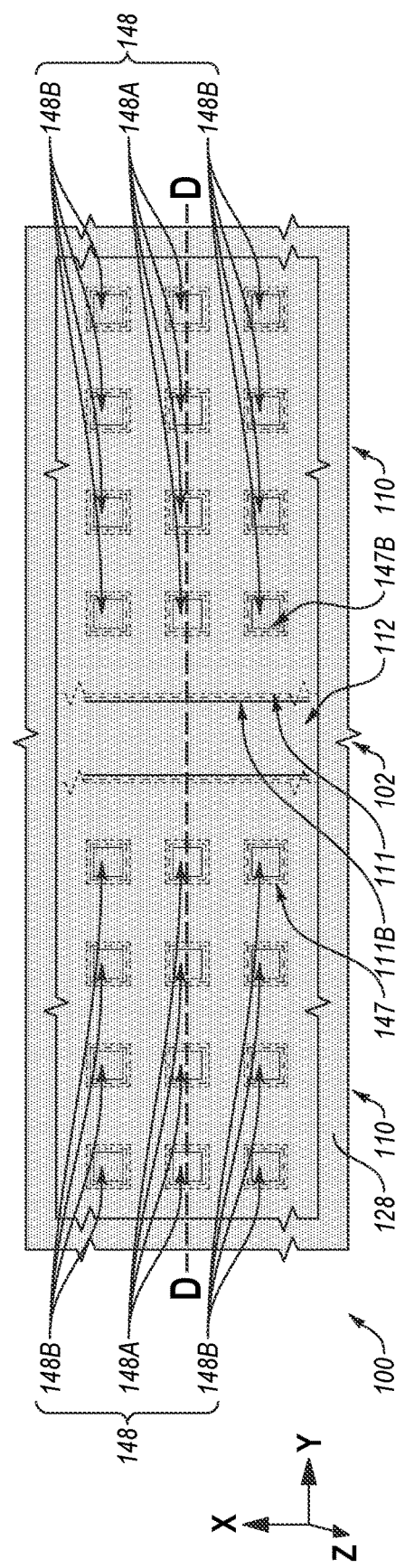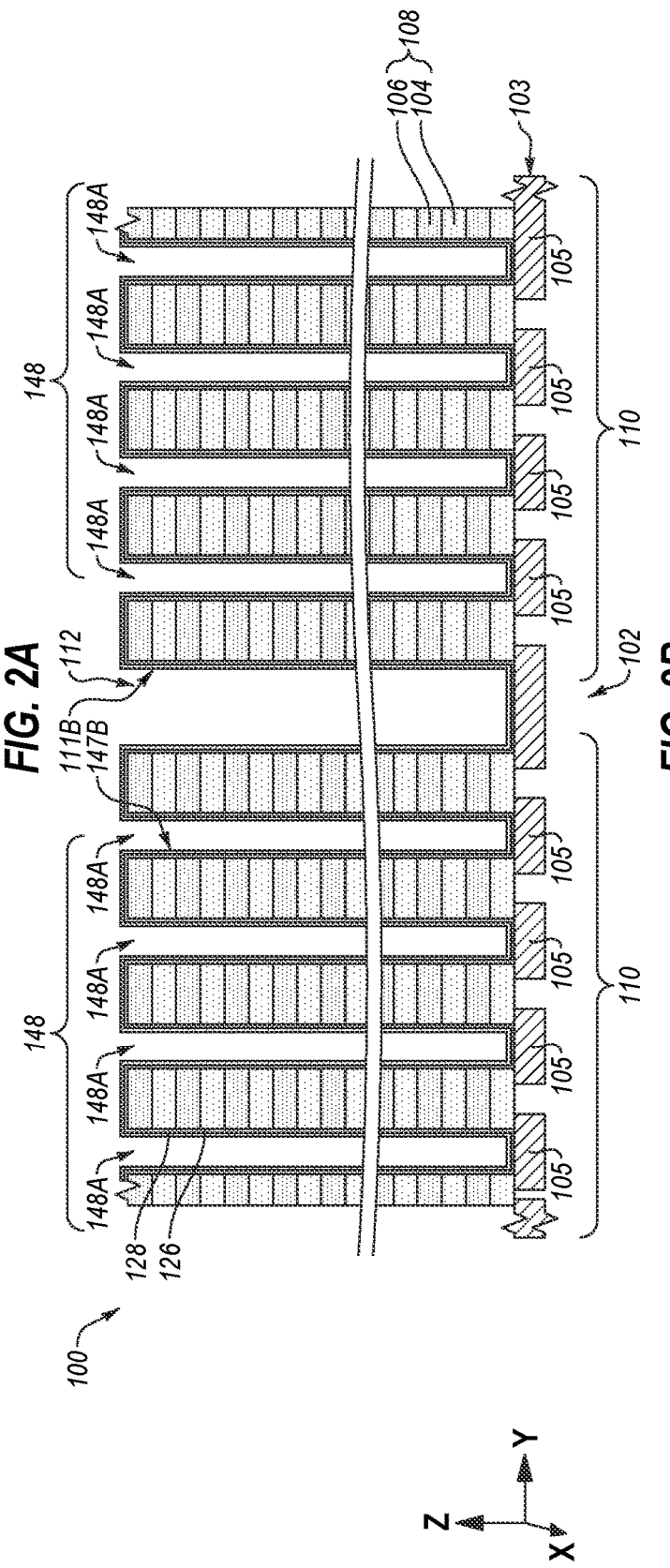

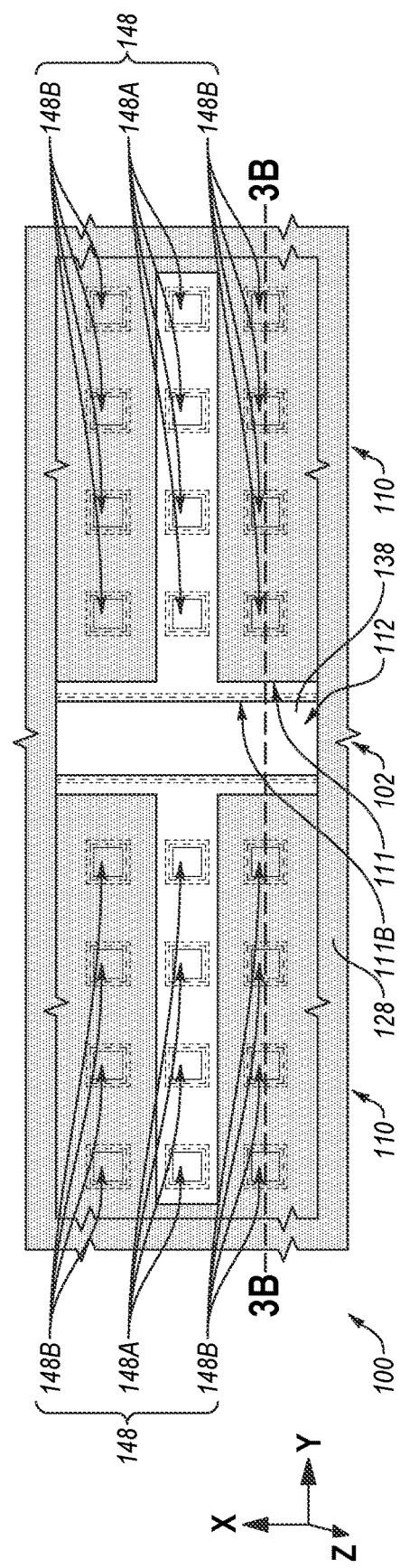
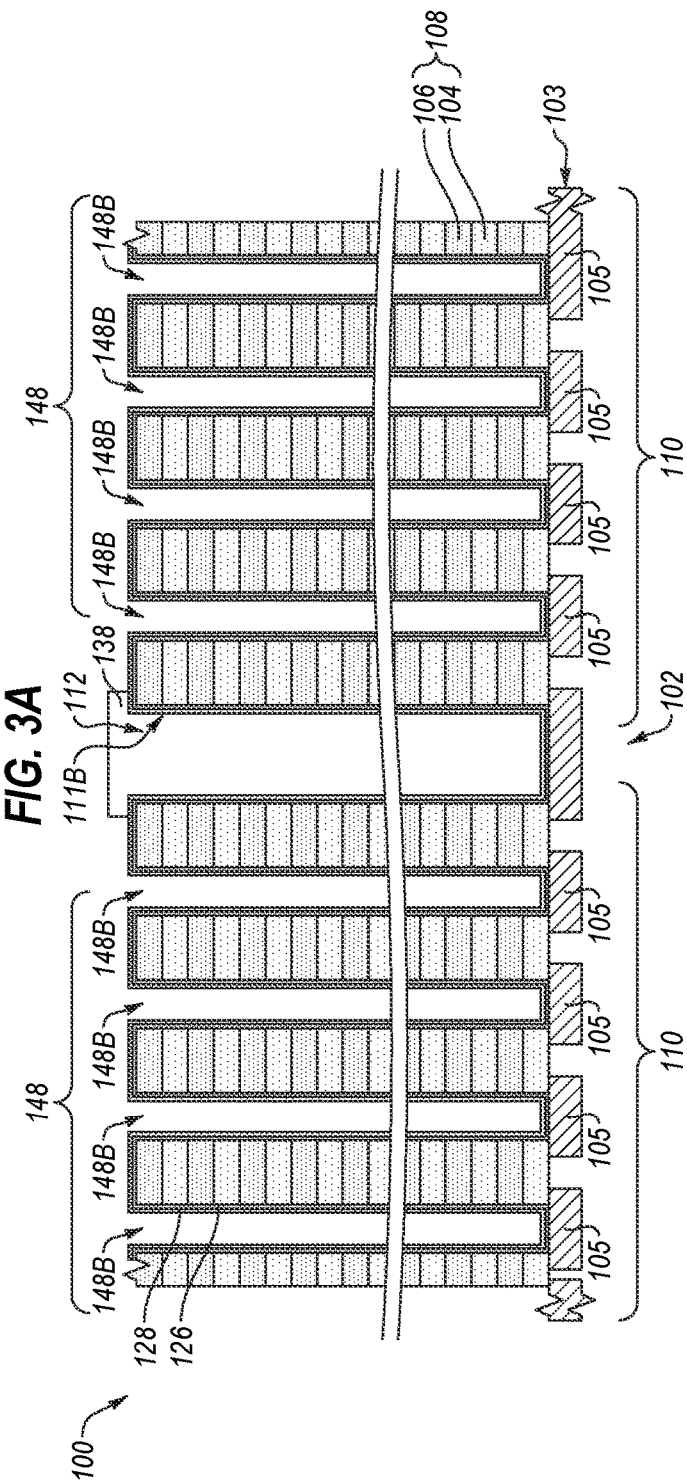
FIG. 3A
FIG. 3B

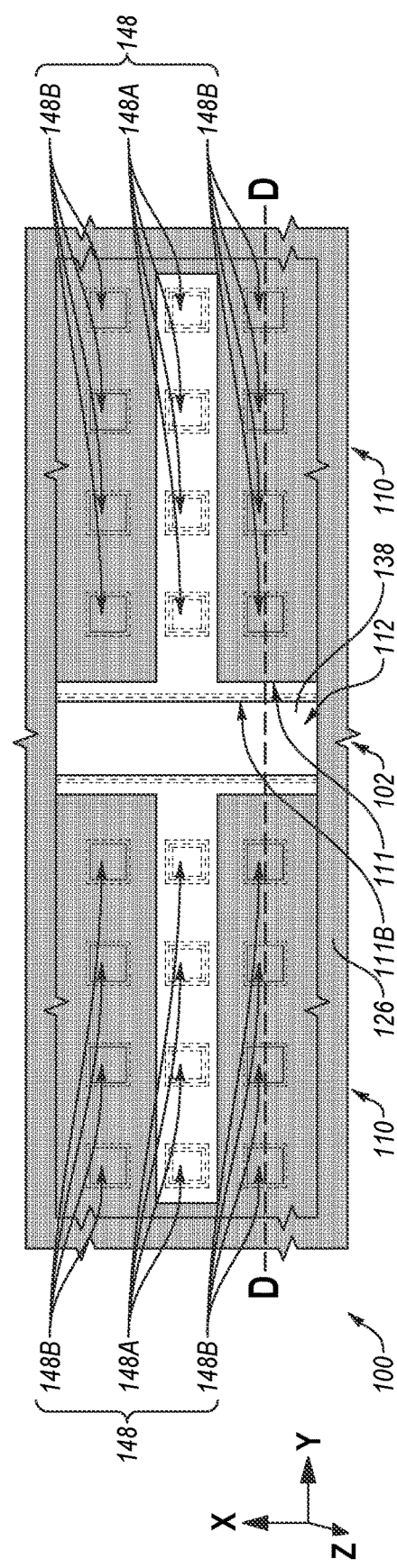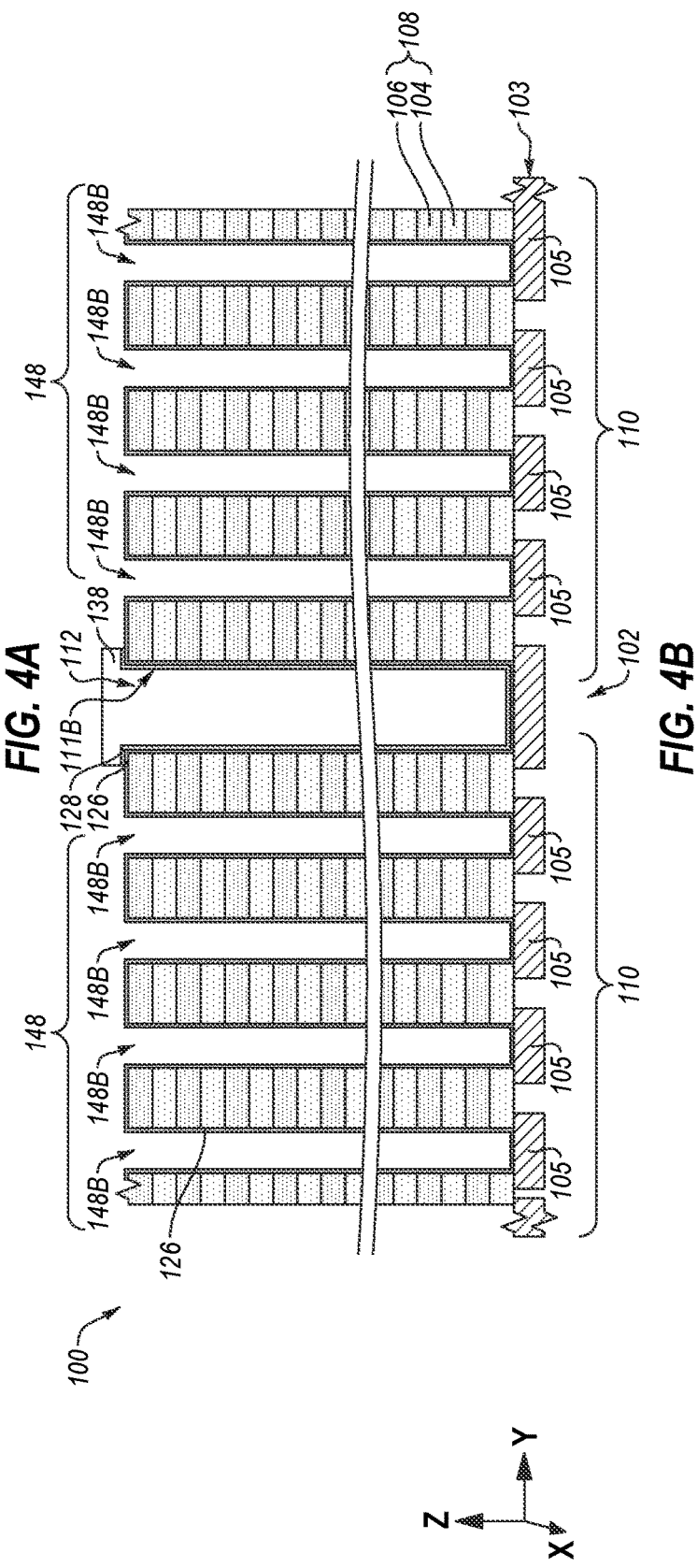
FIG. 4A
FIG. 4B

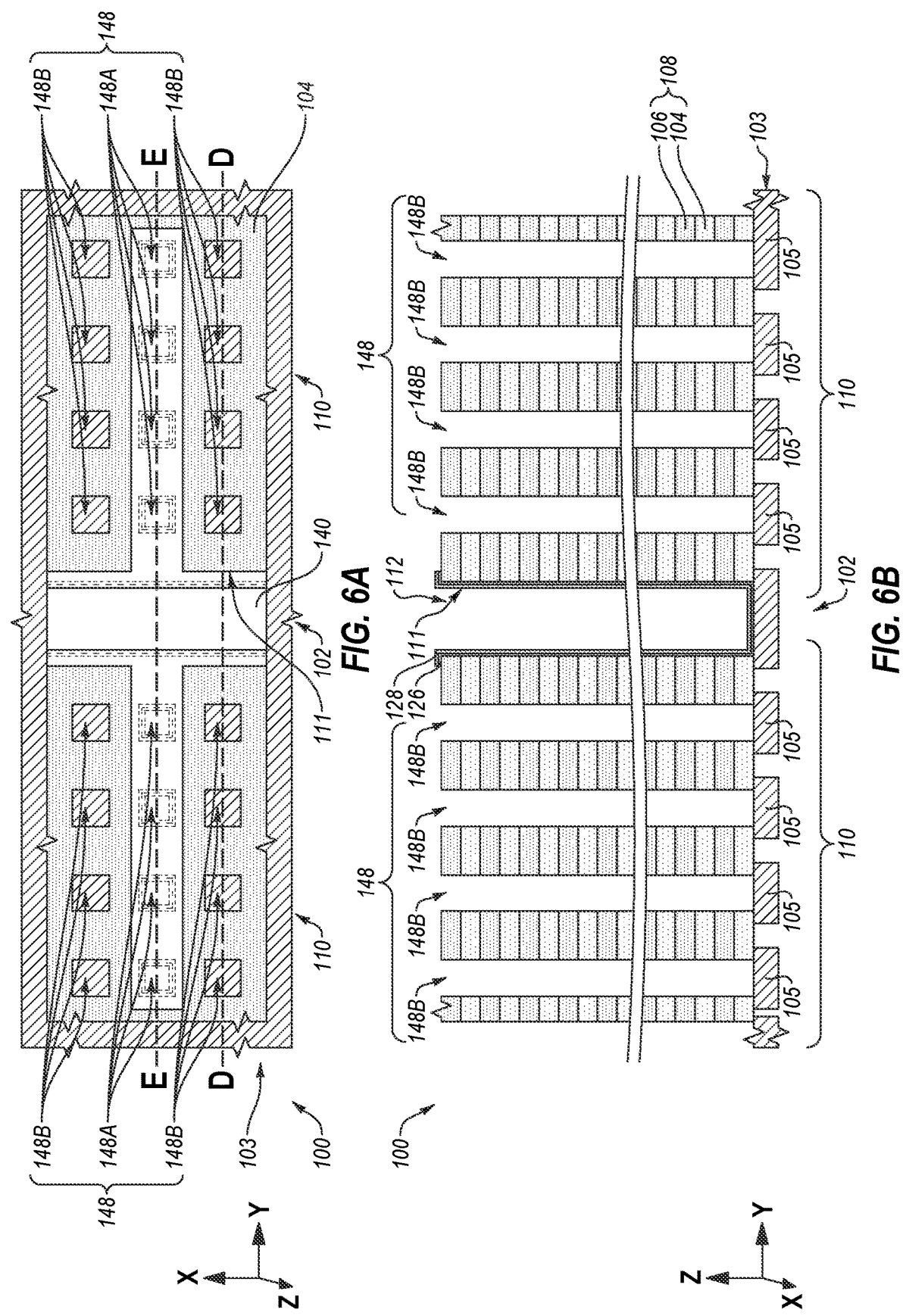

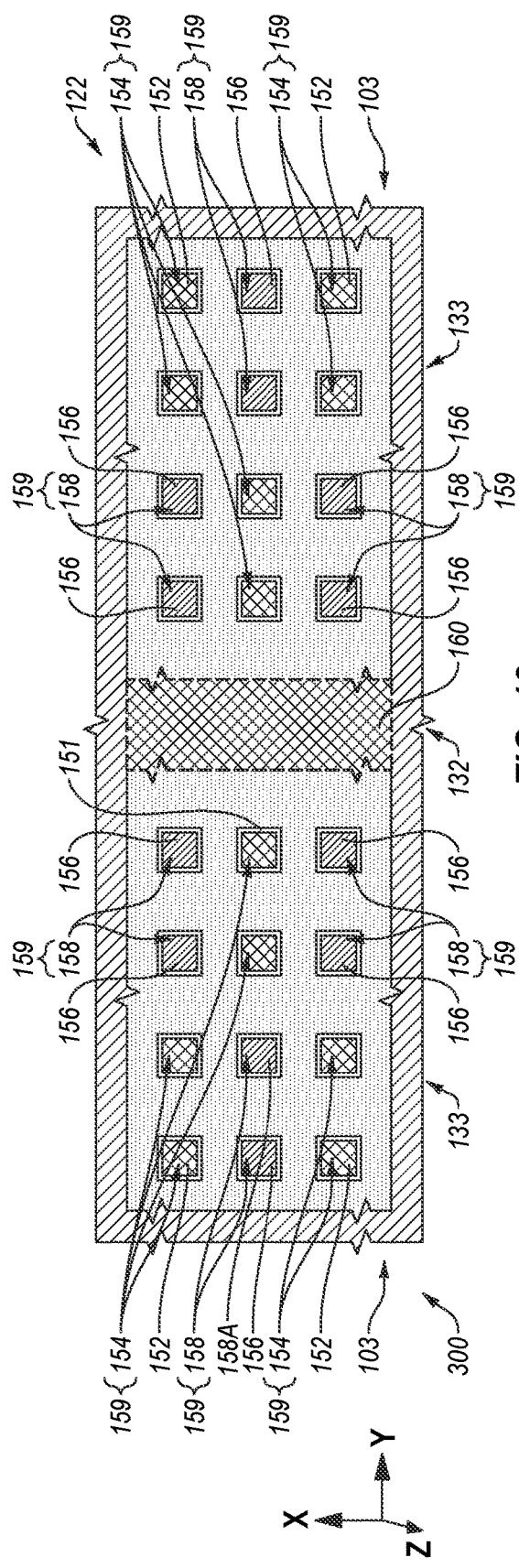
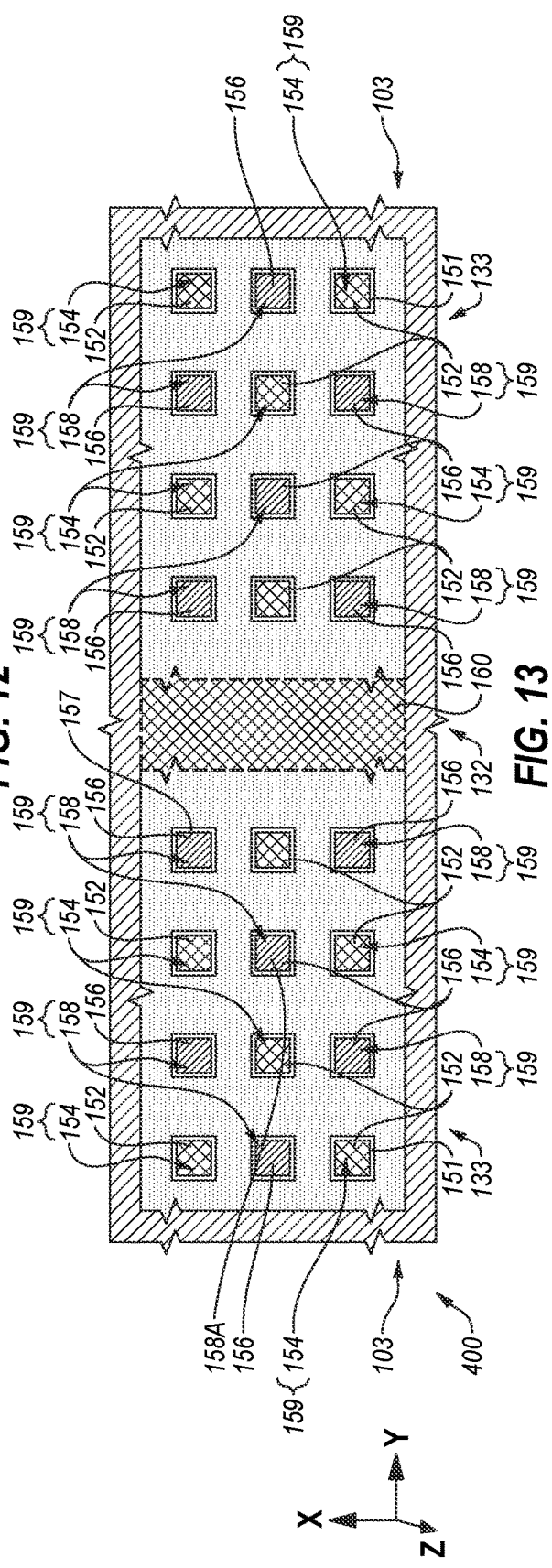
FIG. 12
FIG. 13

METHODS OF FORMING MICROELECTRONIC DEVICES INCLUDING SUPPORT CONTACT STRUCTURES, AND RELATED MICROELECTRONIC DEVICES, MEMORY DEVICES, AND ELECTRONIC SYSTEMS

TECHNICAL FIELD

The disclosure, in various embodiments, relates generally to the field of integrated circuit device design and fabrication. More specifically, the disclosure relates to microelectronic devices including contact structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack structure including tiers of conductive structures and insulative materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure of the memory device, and forming contact structures vertically extending contact structures through the stack structure, including through the staircase structures thereof. The contact structures contact structures also are formed within crest regions of the stack structure horizontally neighboring the staircase structures. Some of the contact structures may be configured and arranged relative to other feature to be electrically active within the memory device, and some other of the contact structures may be configured and arranged relative to other feature to be electrically inactive within the memory device. The contact structures configured and arranged to be electrically inactive frequently serve as support structures during processing employed to form the memory device.

Unfortunately, conventional methods of forming a memory device, such as a NAND (logical "not and") Flash memory device, can result in undesirable damage to the memory devices, such as bending of certain features during and/or after formation, which may lead to undesirable lift-off (e.g., delamination) of features relative to additional features thereunder, and/or undesirable damage to the memory device.

BRIEF DESCRIPTION OF THE DRAWINGS

FIGS. 1A, 1B, 1C and 1D are simplified perspective (FIG. 1A), top-down (FIG. 1B), expanded top-down (FIG. 1C), and longitudinal cross-sectional (FIG. 1D) views of portions of a microelectronic device structure at a processing stage of a method of forming a microelectronic device, in accordance with embodiments of the disclosure.

FIGS. 2A and 2B are simplified, top down (FIG. 2A) and longitudinal cross-sectional (FIG. 2B) views of the portions the microelectronic device structure shown in FIGS. 1C and 1D, respectively, at a processing stage following the processing stage of FIGS. 1A through 1D.

FIGS. 3A and 3B are simplified, top down (FIG. 3A) and longitudinal cross-sectional (FIG. 3B) views of the portions the microelectronic device structure shown in FIGS. 2A and 2B, respectively, at a processing stage following the processing stage of FIGS. 2A and 2B.

FIGS. 4A and 4B are simplified, top down (FIG. 4A) and longitudinal cross-sectional (FIG. 4B) views of the portions the microelectronic device structure shown in FIGS. 3A and 3B, respectively, at a processing stage following the processing stage of FIGS. 3A and 3B.

FIGS. 6A and 6B are simplified, top down (FIG. 6A) and longitudinal cross-sectional (FIG. 6B) views of the portions the microelectronic device structure shown in FIGS. 5A and 5B, respectively, at a processing stage following the processing stage of FIGS. 5A and 5B.

FIGS. 10, 11, 12 and 13 illustrate simplified, top-down views of microelectronic device structures having different arrangements of live contact structures and dummy contact structures, in accordance with embodiments of the disclosure.

DETAILED DESCRIPTION

Figure 1A:
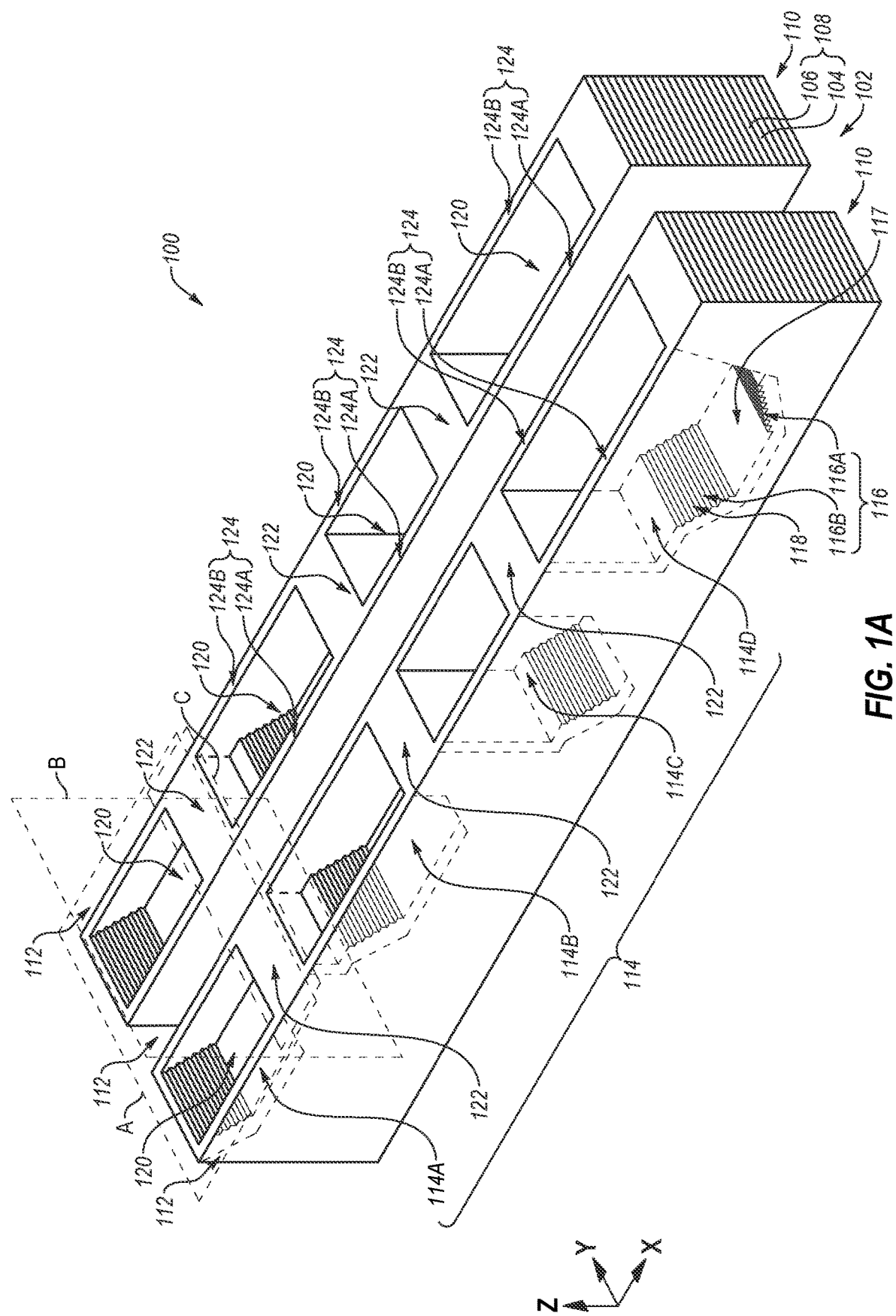

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be assembled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A, 1B, 1C and 1D are simplified views (each described in further detail below) of a microelectronic device structure 100 during a processing stage of a method of forming a microelectronic device, in accordance with several embodiments of this disclosure. As described in further detail below, processing to form the microelectronic device structure 100 may include substantially simultaneously forming slots 112 and contact openings 148 (e.g., FIGS. 1B, 1C and 1D) within a preliminary stack structure 102, filling different contact openings 148 with different material(s), and filling the slots 112 with additional material(s).

Figure 1B:
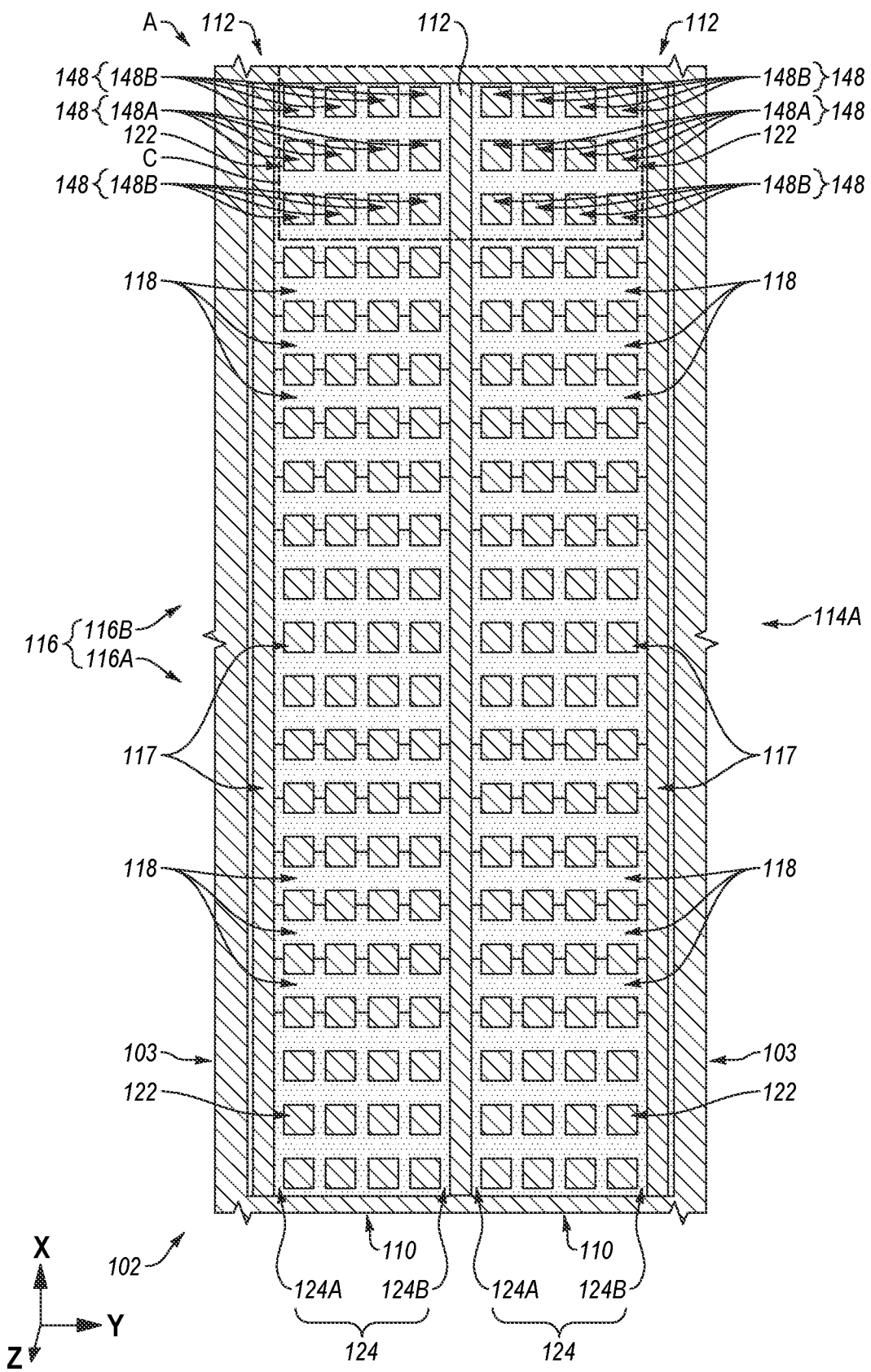

FIG. 1A is a simplified, partial perspective view of the microelectronic device structure 100. FIG. 1B is a simplified, partial top-down view of a portion of the microelectronic device structure 100 depicted in FIG. 1A, taken from a section A in FIG. 1A and at the processing stage of FIG. 1A. FIG. 1C is a simplified, top-down view of a portion of the microelectronic device structure 100 depicted in FIG. 1B, taken from a portion C shown in FIG. 1B. FIG. 1D is a simplified longitudinal cross-section elevation of a portion of the microelectronic device structure 100, taken from a section B in FIG. 1A and from the section line 1D-1D in FIG. 1C, and at the processing stage of FIGS. 1A, 1B, and 1C.

As shown in FIG. 1A, the microelectronic device structure 100 may be formed to include a preliminary stack structure 102 including a vertically alternating (e.g., in a Z-direction) sequence of insulative material 104 and sacrificial material 106 arranged in tiers 108. Each of the tiers 108 of the preliminary stack structure 102 may individually include the sacrificial material 106 vertically neighboring (e.g., directly vertically adjacent) the insulative material 104. In addition, the preliminary stack structure 102 may be divided (e.g., segmented, partitioned) into preliminary blocks 110 separated from one another by slots 112 (e.g., slit areas that are designated to be processed into slot areas, opening areas, trench areas), which are formed as the same time as contact openings 148 (FIGS. 1, 1C, and 1D). The contact openings 148 may include live contact openings 148A (e.g., FIGS. 1B, 1C and 1D) and for support contact openings 148B (e.g., FIGS. 1B, 1C and 1D). The slots 112 and the contact openings 148, may vertically extend (e.g., in the Z-direction) substantially completely through the preliminary stack structure 102. Additional features (e.g., materials, structures) of the preliminary stack structure 102 (including the preliminary blocks 110 thereof) are described in further detail below. The slots 112 set apart the preliminary blocks 110, and the preliminary blocks 110 of the preliminary stack structure 102 may individually include stadium structures 114, crest regions 122 (e.g., elevated regions), and bridge regions 124 (e.g., additional elevated regions). The stadium structures 114 may be distributed throughout and substantially confined within horizontal areas of the preliminary blocks 110. Each of the stadium structures 114 may be formed sequentially, beginning with the first stadium structure 114A first formed (and intermediate stadium structures 114B, 114C and 114D also formed at the height (Z-direction) of the first stadium structure 114A), followed by masking the first stadium structure 114A, and completing location of the second stadium structure 114B (and the intermediate stadium structures 114C and 114D also formed at the height (Z-direction) of the second stadium structure 114B), followed by masking the first stadium structure 114A and the second stadium structure 114B, and completing location of the third stadium structure 114C (and the intermediate stadium structure 114D also formed at the height (Z-direction) of the third stadium structure 114C), followed by masking the first stadium structure 114A, the second stadium structure 114B and the third stadium structure 114C, and completing location of the fourth stadium structure 114D, as finally illustrated in FIG. 1A. Each sequential masking of completed locations of stadium structures, while forming intermediate stadium structures (and a completed location of a formerly intermediate stadium structure) may be referred to as a "chop" technique, such that, e.g., the fourth stadium structure 114D is located lower (Z-direction) than each of the other stadium structures 114A, 114B and 114C.

Each of the preliminary blocks 110 may include filled trenches 120 vertically overlying and within horizontal areas of the stadium structures 114 thereof. The crest regions 122 may be horizontally interposed between stadium structures 114 horizontally neighboring one another in the X-direction. The bridge regions 124 may horizontally neighbor opposing sides of individual stadium structures 114 in the Y-direction (hereinafter also referred to as the "first direction"), and may horizontally extend from and between crest regions 122 horizontally neighboring one another in the X-direction (hereinafter also referred to as the "second direction"). In FIG. 1A, for clarity and ease of understanding the drawings and associated description, portions (e.g., some of the bridge regions 124 horizontally neighboring first sides of the stadium structures 114 in the Y-direction) of one of the preliminary blocks 110 of the preliminary stack structure 102 are depicted as transparent to more clearly show the stadium structures 114 distributed within the preliminary block 110.

The insulative material 104 of each of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 104 of each of the tiers 108 of the preliminary stack structure 102 is formed of and includes a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and at least one semiconductive material (e.g., polycrystalline silicon, or "poly"). In some embodiments, the sacrificial material 106 of each of the tiers 108 of the preliminary stack structure 102 is formed of and includes a dielectric nitride material, such as $SiN_y$ (e.g., $Si_3N_4$). The sacrificial material 106 may, for example, be selectively etchable relative to the insulative material 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Still referring to FIG. 1A, the preliminary blocks 110 of the preliminary stack structure 102 may horizontally extend parallel in an X-direction. As used herein, the term "parallel" means substantially parallel. Horizontally neighboring preliminary blocks 110 of the preliminary stack structure 102 may be separated from one another in a Y-direction orthogonal to the X-direction by the slots 112. The slots 112 may also horizontally extend parallel in the X-direction. Each of the preliminary blocks 110 of the preliminary stack structure 102 may exhibit substantially the same geometric configuration (e.g., substantially the same dimensions and substantially the same shape) as each other of the preliminary blocks 110, or one or more of the preliminary blocks 110 may exhibit a different geometric configuration (e.g., one or more different dimensions and/or a different shape) than one or more other of the preliminary blocks 110. In addition, each pair of horizontally neighboring preliminary blocks 110 of the preliminary stack structure 102 may be horizontally separated from one another by substantially the same distance (e.g., corresponding to a width in the Y-direction of each of the slots 112) as each other pair of horizontally neighboring preliminary blocks 110 of the preliminary stack structure 102, or at least one pair of horizontally neighboring preliminary blocks 110 of the preliminary stack structure 102 may be horizontally separated from one another by a different distance than that separating at least one other pair of horizontally neighboring preliminary blocks 110 of the preliminary stack structure 102. In some embodiments, the preliminary blocks 110 of the preliminary stack structure 102 are substantially uniformly (e.g., substantially non-variably, substantially equally, substantially consistently) sized, shaped, and spaced relative to one another.

For example, an individual preliminary block 110 of the preliminary stack structure 102 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). As another example, within an individual preliminary block 110, stadium structures 114 may be at least partially non-uniformly (e.g., non-equally, non-evenly) horizontally spaced, such that at least one of the stadium structures 114 is separated from at least two other of the stadium structures 114 horizontally neighboring (e.g., in the X-direction) the at least one stadium structures 114 by different (e.g., non-equal) distances. As an additional non-limiting example, within an individual preliminary block 110, vertical positions (e.g., in the Z-direction) of the stadium structures 114 may vary in a different manner (e.g., may alternate between relatively deeper and relatively shallower vertical positions) than that depicted in FIG. 1A.

Each stadium structure 114 may include opposing staircase structures 116, and a central region 117 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1A. As a non-limiting example, at least one stadium structures 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 117 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure 116B) of an individual stadium structure 114 each include steps 118 defined by edges (e.g., horizontal ends) of the tiers 108 of the preliminary stack structure 102 within a horizontal area of an individual preliminary block 110 of the preliminary stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 117 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114.

Each of the stadium structures 114 within an individual preliminary block 110 of the preliminary stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1A, in some embodiments, the steps 118 of each of the stadium structures 114 are arranged in order, such that steps 118 directly horizontally adjacent (e.g., in the X-direction) one another correspond to tiers 108 of the preliminary stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of preliminary stack structure 102 not directly vertically adjacent (e.g., in the Z-direction) one another.

With continued reference to FIG. 1A, for an individual stadium structure 114, the central region 117 thereof may horizontally intervene (e.g., in the X-direction) between and separate the forward staircase structure 116A thereof from the reverse staircase structure 116B thereof. The central region 117 may horizontally neighbor a vertically lowermost step 118 of the forward staircase structure 116A, and may also horizontally neighbor a vertically lowermost step 118 of the reverse staircase structure 116B. The central region 117 of an individual stadium structure 114 may have any desired horizontal dimensions. In addition, within an individual preliminary block 110 of the preliminary stack structure 102, the central region 117 of each of the stadium structures 114 may have substantially the same horizontal dimensions as the central region 117 of each other of the stadium structures 114, or the central region 117 of at least one of the stadium structures 114 may have different horizontal dimensions than the central region 117 of at least one other of the stadium structures 114.

For each preliminary block 110 of the preliminary stack structure 102, each stadium structure 114 (including the forward staircase structure 116A, the reverse staircase structure 116B, and the central region 117 thereof) within the preliminary block 110 may individually partially define boundaries (e.g., horizontal boundaries, vertical boundaries) of a filled trench 120 vertically extending (e.g., in the Z-direction) through the preliminary block 110. The crest regions 122 and the bridge regions 124 horizontally neighboring an individual stadium structure 114 may also partially define the boundaries of the filled trench 120 associated with the stadium structure 114. The filled trench 120 may only vertically extend through tiers 108 of the preliminary stack structure 102 defining the forward staircase structure 116A and the reverse staircase structure 116B of the stadium structure 114; or may also vertically extend through additional tiers 108 of the preliminary stack structure 102 not defining the forward staircase structure 116A and the reverse staircase structure 116B of the stadium structure 114, such as additional tiers 108 of the preliminary stack structure 102 vertically overlying the stadium structure 114. Edges of the additional tiers 108 of the preliminary stack structure 102 may, for example, define one or more additional stadium structures vertically overlying and horizontally offset from the stadium structure 114. Still referring to FIG. 1A, for each preliminary block 110 of the preliminary stack structure 102, the crest regions 122 (which may also be referred to as "elevated regions" or "plateau regions") and the bridge regions 124 (which may also be referred to as "additional elevated regions" or "additional plateau regions") thereof may comprise portions of the preliminary block 110 remaining following the formation of the stadium structures 114. Within each preliminary block 110, crest regions 122 and the bridge region 124 thereof may define horizontal boundaries (e.g., in the X-direction and in the Y-direction) of unremoved portions of the tiers 108 of the preliminary stack structure 102.

As shown in FIG. 1A, the crest regions 122 of an individual preliminary block 110 of the preliminary stack structure 102 may intervene between and separate stadium structures 114 horizontally neighboring one another in the X-direction. For example, one of the crest regions 122 may intervene between and separate the first stadium structure 114A and the second stadium structure 114B; an additional one of the crest regions 122 may intervene between and separate the second stadium structure 114B and the third stadium structure 114C; and a further one of the crest regions 122 may intervene between and separate the third stadium structure 114C and the fourth stadium structure 114D. A vertical height of the crest regions 122 in the Z-direction may be substantially equal to a maximum vertical height of the preliminary block 110 in the Z-direction; and a horizontal width of the crest regions 122 in the Y-direction may be substantially equal to a maximum horizontal width of the preliminary block 110 in the Y-direction. In addition, each of the crest regions 122 may individually exhibit a desired horizontal length in the X-direction. Each of the crest regions 122 of an individual preliminary block 110 of the preliminary stack structure 102 may exhibit substantially the same horizontal length in the X-direction as each other of the crest regions 122 of the preliminary block 110; or at least one of the crest regions 122 of the preliminary block 110 may exhibit a different horizontal length in the X-direction than at least one other of the crest regions 122 of the preliminary block 110.

As shown in FIG. 1A, the bridge regions 124 of an individual preliminary block 110 of the preliminary stack structure 102 may intervene between and separate the stadium structures 114 if the preliminary block 110 from the slots 112 horizontally neighboring the preliminary block 110 in the Y-direction. For example, for each stadium structure 114 within an individual preliminary block 110 of the preliminary stack structure 102, a first bridge region 124A may be horizontally interposed in the Y-direction between a first side of the stadium structure 114 and a first of the slots 112 horizontally neighboring the preliminary block 110; and a second bridge region 124B may be horizontally interposed in the Y-direction between a second side of the stadium structure 114 and a second of the slots 112 horizontally neighboring the preliminary block 110. The first bridge region 124A and the second bridge region 124B may horizontally extend in parallel in the X-direction. In addition, the first bridge region 124A and the second bridge region 124B and may each horizontally extend from and between crest regions 122 of the preliminary block 110 horizontally neighboring one another in the X-direction. The bridge regions 124 of the preliminary block 110 may be integral and continuous with the crest regions 122 of the preliminary block 110. Upper boundaries (e.g., upper surfaces) of the bridge regions 124 may be substantially coplanar with upper boundaries of the crest regions 122. A vertical height of the bridge regions 124 in the Z-direction may be substantially equal to a maximum vertical height of the preliminary block 110 in the Z-direction. In addition, each of the bridge regions 124 (including each first bridge region 124A and each second bridge region 124B) may individually exhibit a desired horizontal width in the Y-direction and a desired horizontal length in the X-direction. Each of the bridge regions 124 of the preliminary block 110 may exhibit substantially the same horizontal length in the X-direction as each other of the bridge regions 124 of the preliminary block 110; or at least one of the bridge regions 124 of the preliminary block 110 may exhibit a different horizontal length in the X-direction than at least one other of the bridge regions 124 of the preliminary block 110. In addition, each of the bridge regions 124 of the preliminary block 110 may exhibit substantially the same horizontal width in the Y-direction as each other of the bridge regions 124 of the preliminary block 110; or at least one of the bridge regions 124 of the preliminary block 110 may exhibit a different horizontal width in the Y-direction than at least one other of the bridge regions 124 of the preliminary block 110.

For each preliminary block 110 of the preliminary stack structure 102, the bridge regions 124 thereof horizontally extend around the filled trenches 120 of the preliminary block 110. As described in further detail below, following subsequent processing (e.g., so-called "replacement gate" or "gate last" processing), some of the bridge regions 124 of the preliminary block 110 may be employed to form continuous conductive paths extending from and between horizontally neighboring crest regions 122 of the preliminary block 110. As also described in further detail below, following such subsequent (e.g., replacement gate) processing, at least the bridge regions 124 (e.g., the first bridge region 124A and the second bridge region 124B) horizontally neighboring the first stadium structure 114A in the Y-direction may be further acted upon (e.g., segmented) to disrupt (e.g., break) at least a portion of the continuous conductive paths extending from and between the crest regions 122 horizontally neighboring the first stadium structure 114A in the X-direction. Selected results of replacement gate processing is depicted in part at FIG. 8B and FIG. 9, after several processing stages of this disclosure.

FIG. 1B is a simplified, partial top-down view of section A of the microelectronic device structure 100 shown in FIG. 1A. The section A includes portions of two of the preliminary blocks 110 of the preliminary stack structure 102, as well a portion of one of the slots 112 horizontally interposed between the two of the preliminary blocks 110. The section A encompasses first stadium structures 114A within the two of the preliminary blocks 110, as well as additional regions of the two of the preliminary blocks 110 and the intervening slot 112. A source tier 103 (also FIGS. 1C and 1D) vertically underlies the preliminary stack structure 102, and include one or more source tier structures 105 (e.g., conductive structures, such as conductive plates, conductive lines, conductive islands) therein.

Slots 112 and the contact openings 148 extending through the preliminary blocks 110 may be formed sequentially or substantially simultaneously with one another. In an embodiment, the contact openings 148 are formed, followed by masking to expose only X-Y locations of the slots 112, followed by the formation of slots 112. When the slots 112 and the contact openings 148 are completed, each the slots 112 and each of the e contact openings 148 may extend to and expose portions of the source tier 103. The contact openings 148 may be depicted in an embodiment, as alternating rows (Y-direction) of live contact openings 148A and support contact openings 148B. The source tier 103 is seen through the contact openings 148 and the slot 112 in FIGS. 1B and 1C. In an embodiment, the slots 112, along with contact openings 148, have been formed in a single material removal operation.

Referring to FIG. 1C, simplified, partial top-down view of a portion C (e.g., sub-section) of the section A shown in FIGS. 1A and 1B is illustrated. The slot 112 is at least partially defined by side surfaces 111 of the tiers 108 (in the X-Z planes) (e.g., outer sidewalls) of the preliminary blocks 110; and each of the contact openings 148 (such as an insulative support contact opening 148B) is defined by additional sidewalls (e.g., inner sidewalls) of the preliminary blocks 110. In addition to the support contact openings 148B, live contact openings 148A are depicted, where following subsequent processing, live contact structures (e.g., 154A in FIG. 8A) are formed within the live contact openings 148A.

Referring to next FIG. 1D, a longitudinal cross-sectional elevation view of section B (FIG. 1A) of the microelectronic device structure 100 is depicted. The view of FIG. 1D also corresponds to the section line D-D seen in FIG. 1C. Further structure is also depicted in FIG. 1D including a routing tier 109 that may be coupled to the source tier 103 through an interconnect tier 113 (although no interconnect structures are depicted in the interconnect tier 113 in this cross-section view of the microelectronic device structure 100).

FIGS. 2A and 2B illustrate different views of portions of the microelectronic device structure 100, at a processing stage following that of FIGS. 1A through 1D. FIG. 2A is a simplified, partial top-down view of the portion C of the microelectronic device structure 100 shown in FIG. 1C. FIG. 2B is a longitudinal cross-sectional elevation view of the microelectronic device structure 100 depicted in FIG. 2A along the section line D-D depicted in FIG. 2A. As shown in FIG. 2B, a sacrificial first liner 126 is formed (e.g., conformally formed) on and over surfaces of microelectronic device structure 100, and a sacrificial second liner 128 (e.g., conformally formed) is formed on or over the sacrificial first liner 126. The sacrificial first liner 126 is formed on or over surfaces of the microelectronic device structure 100 defining the slots 112 and contact openings 148, and may partially fill the slots 112 and contact openings 148. The sacrificial second liner 128 is formed on or over surfaces of the sacrificial first liner 126, and may partially fill portions of the slots 112 and contact openings 148 not occupied by the sacrificial first liner 126.

The sacrificial first liner 126 may be formed of and include conductive nitride material (e.g., a metal nitride material), such as such as a titanium nitride ($TiN_y$), that is useful for etch-selectivity differentiation among different features (e.g., the insulative material 104, the sacrificial material 106, the material of the source tier 103) of the microelectronic device structure 100 during common (e.g., mutual) exposure to a given etchant. In an embodiment, the sacrificial first liner 126 is formed of and include $TiN_y$, and has a thickness within a range of from about 10 Angstroms (Å) to about 100 Å. In an embodiment, the sacrificial first liner 126 is formed by way of atomic layer deposition (ALD).

The sacrificial second liner 128 may be formed of and include a material having etch selectivity relative to the sacrificial first liner 126. The sacrificial second liner 128 may, for example, be formed of and include a dielectric material, such as a dielectric oxide material (e.g., silicon oxide ($SiO_x$)), that is useful for etch-selectivity differentiation among different features (e.g., the insulative material 104, the sacrificial material 106, the material of the source tier 103) of the microelectronic device structure 100 during common (e.g., mutual) exposure to a given etchant. In an embodiment, the sacrificial second liner 128 is formed of and includes $SiO_2$, and has a thickness within a range from about 10 Å to about 100 Å. In an embodiment, the sacrificial second liner 128 is formed by way of ALD.

FIGS. 3A and 3B illustrate different views of portions of the microelectronic device structure 100, at a processing stage following that of FIGS. 2A and 2B. FIG. 3A is a simplified, partial top-down view of the portion C of the microelectronic device structure 100 shown in FIG. 2A. FIG. 3B is a longitudinal cross-sectional elevation view of the microelectronic device structure 100 depicted in FIG. 3A along the section line D-D depicted in FIG. 3A. As collectively depicted in FIGS. 3A and 3B, a first mask material 138 may be formed within the slots 112 and the live contact openings 148A, without being formed in the support contact openings 148B. The first mask material 138 may substantially fill the slots 112 and the live contact openings 148A, and the support contact openings 148B may remain substantially free of the first mask material 138.

The first mask material 138 may be formed of and include at least one material that may be selectively removed relative to the sacrificial first liner 126 and the second sacrificial second liner 128. For example, the first mask material 138 may be formed of and include a photoresist material (e.g., a positive tone photoresist material, a negative tone photoresist material). In some embodiment, the first mask material 138 is formed of and includes a positive tone photoresist material.

FIGS. 4A and 4B illustrate different views of portions of the microelectronic device structure 100, at a processing stage following that of FIGS. 3A and 3B. FIG. 4A is a simplified, partial top-down view of the portion C of the microelectronic device structure 100 shown in FIG. 4A. FIG. 4B is a longitudinal cross-sectional elevation view of the microelectronic device structure 100 depicted in FIG. 4A along the section line D-D depicted in FIG. 4A. As shown in FIG. 4B, portions of the sacrificial second liner 128 (FIG. 3B) within the support contact openings 148B may be selectively removed to expose underlying portions of the sacrificial first liner 126. Additional portions of the sacrificial second liner 128 protected by the first mask material 138 may remain unremoved. For example, additional portions of the sacrificial second liner 128 within the slots 112 and the live contact openings 148A may not be removed. In addition, the sacrificial first liner 126 may also remain following the removal of the exposed portions of the sacrificial second liner 128.

In an embodiment, a wet etching process (e.g., a buffered oxide etching (BOE) process) is used to remove the exposed portions of the sacrificial second liner 128. The wet etching process may include a wet-etch chemistry that substantially removes exposed portions of the sacrificial second liner 128, without substantially removing the underlying sacrificial first liner 126.

Figure 5A:
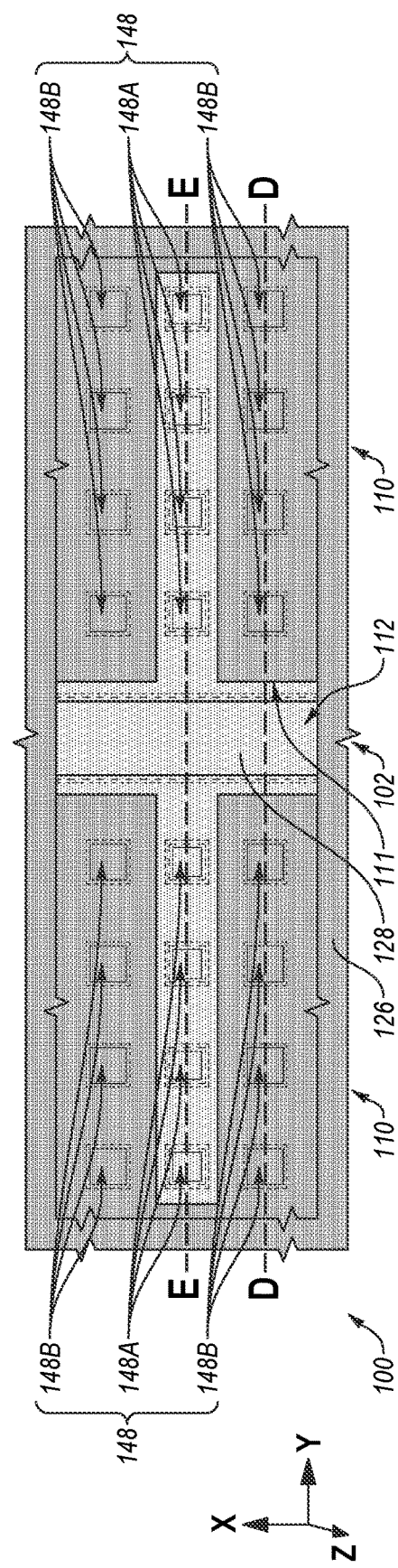
FIGS. 5A and 5B are simplified, top down (FIG. 5A) and longitudinal cross-sectional (FIG. 5B) views of the portions the microelectronic device structure shown in FIGS. 4A and 4B, respectively, at a processing stage following the processing stage of FIGS. 4A and 4B.
Figure 5B:
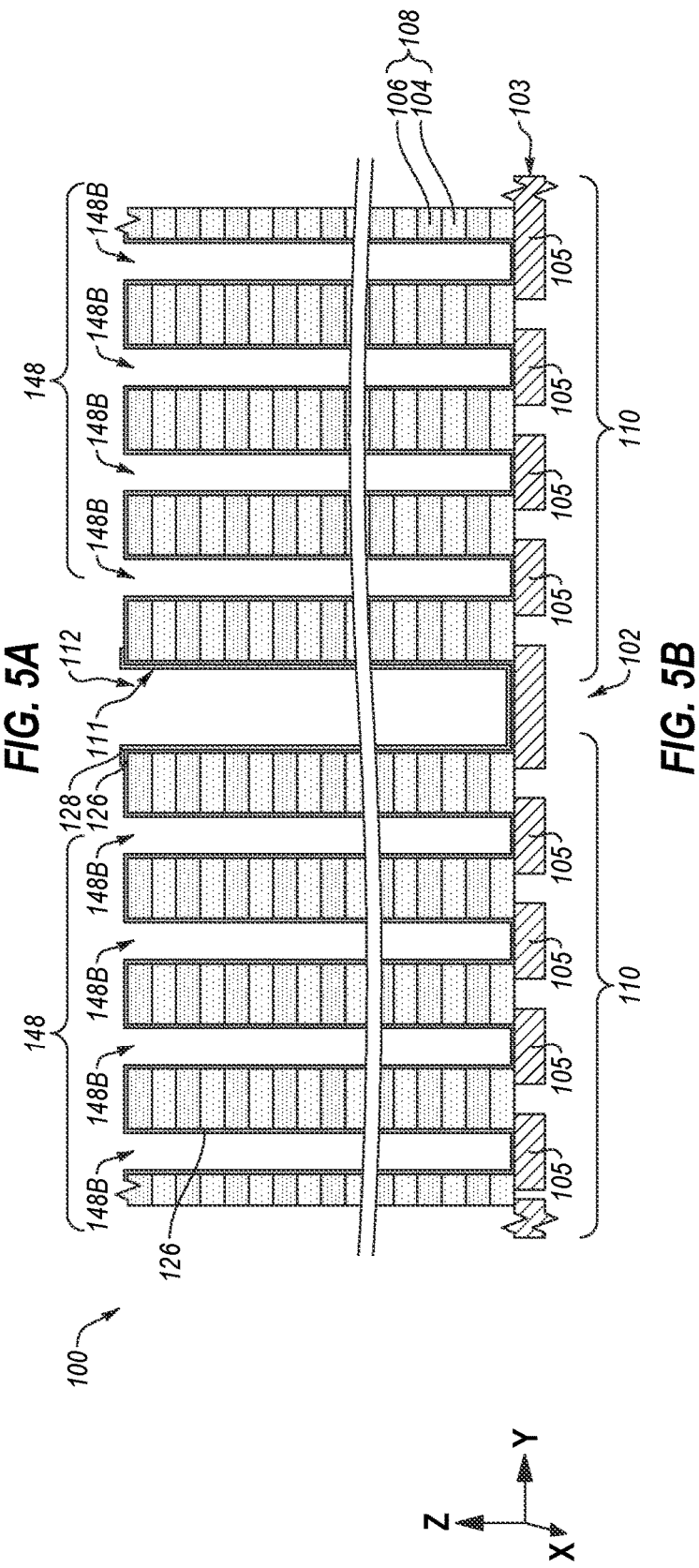

FIGS. 5A and 5B illustrate different views of portions of the microelectronic device structure 100, at a processing stage following that of FIGS. 4A and 4B. FIG. 5A is a simplified, partial top-down view of the portion C of the microelectronic device structure 100 shown in FIG. 4A. FIG. 5B is a longitudinal cross-sectional elevation view of the microelectronic device structure 100 depicted in FIG. 5A along the section line D-D shown in FIG. 5A. As shown in FIGS. 5A and 5B, the first mask material 138 (FIGS. 4A and 4B) may be selectively removed. The removal of the first mask material 138 (FIGS. 4A and 4B) may expose (e.g., uncover) portions of the sacrificial second liner 128 remaining following the processing stage of FIGS. 4A and 4B, such as portions of the sacrificial second liner 128 within the slots 112 and the live contact openings 148A. The sacrificial first liner 126 may also remain following the removal of the first mask material 138 (FIGS. 4A and 4B). A dry material removal process, such as a dry stripping process, may be used to remove the first mask material 138.

FIGS. 6A and 6B illustrate different views of portions of the microelectronic device structure 100, at a processing stage following that of FIGS. 5A and 5B. FIG. 6A is a simplified, partial top-down view of the portion C of the microelectronic device structure 100 shown in FIG. 5A. FIG. 6B is a longitudinal cross-sectional elevation view of the microelectronic device structure 100 depicted in FIG. 6A along the section line D-D shown in FIG. 6A. As shown in FIGS. 6A and 6B, the sacrificial first liner 126 remaining uncovered by sacrificial second liner 128 is selectively removed from the support contact openings 148B, while the sacrificial first liner 126 covers the slots 112 and the live contact openings 148A. Accordingly, the sacrificial first liner 126 may be substantially removed from the support contact openings 148B through the material removal process effectuated by, e.g., an ammonia peroxide strip (APS) that is selective to leaving the sacrificial second liner 128 with the use of a mask 140, but removal of the sacrificial first liner 126 may expose surfaces of the preliminary stack structure 102 and the source tier 103 defining the support contact openings 148B. In an embodiment, the material removal process to remove exposed portions of the sacrificial first liner 126, is an APS process, but any useful material removal technique may be used, so long as the sacrificial first liner 126 is removed from the insulative support contact openings 148B.

Figure 7A:
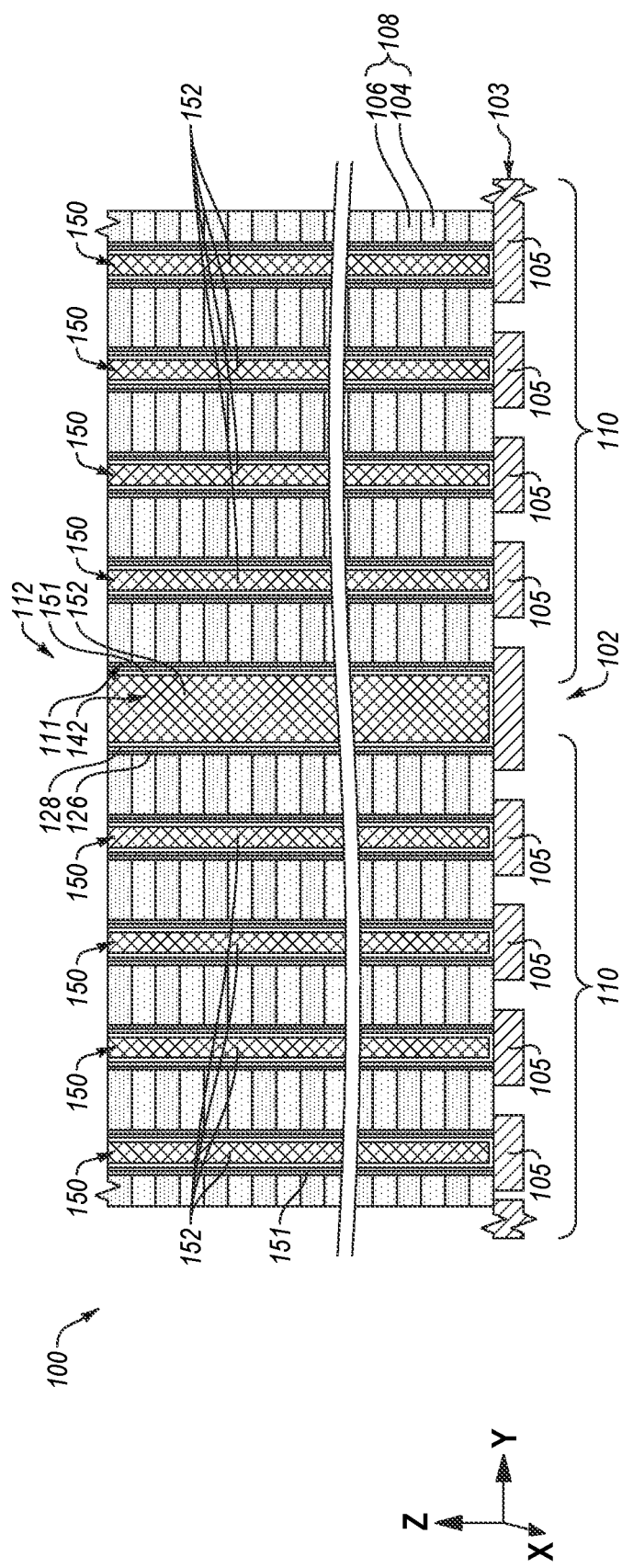
FIGS. 7A and 7B are simplified longitudinal cross-section elevation views of different portions of the microelectronic device structure depicted in FIGS. 6A and 6B after further processing following the processing stage of FIGS. 6A and 6B.
Figure 7B:
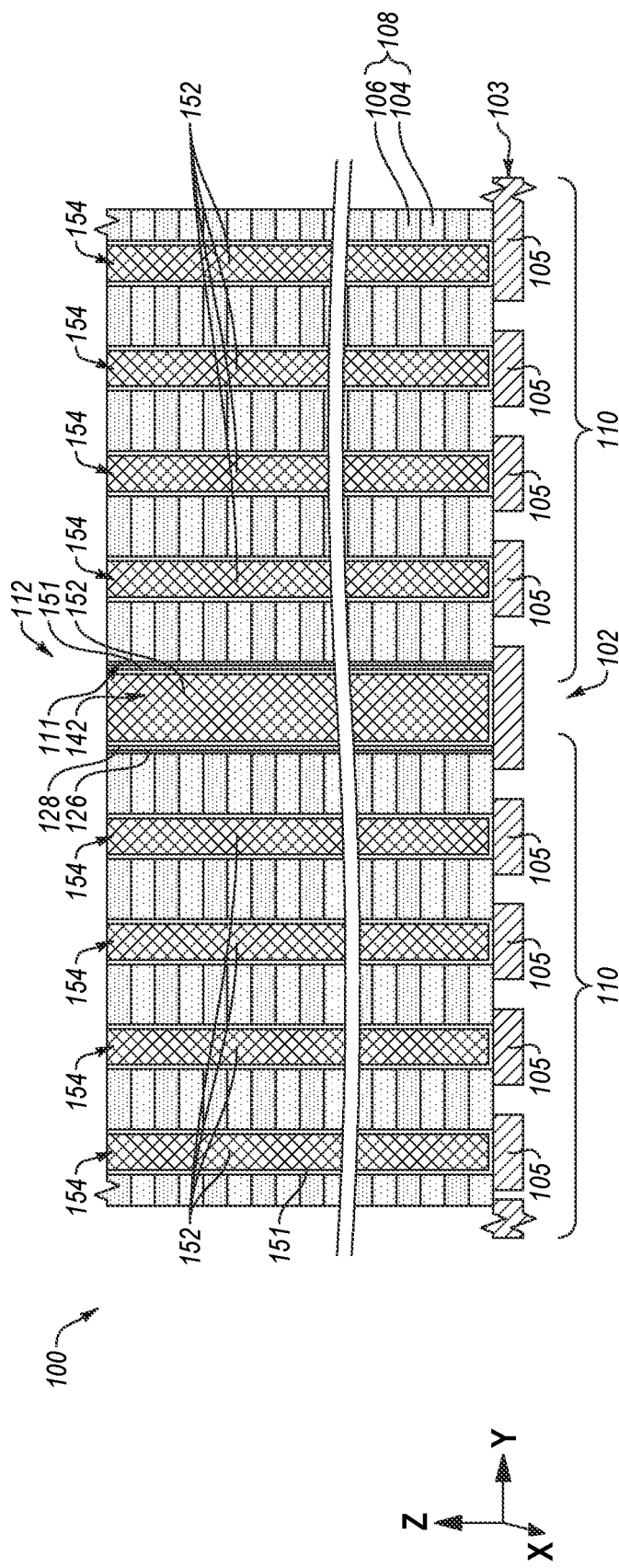

FIGS. 7A and 7B are different longitudinal cross-sectional elevation view of portions of the microelectronic device structure 100, at a processing stage following that of FIGS. 6A and 6B. FIG. 7A is a longitudinal cross-sectional elevation view of the microelectronic device structure 100 along a section line E-E shown in FIG. 6A, at the processing stage following that of FIGS. 6A and 6B. FIG. 7B is a longitudinal cross-sectional elevation view of the microelectronic device structure 100 along the section line D-D shown in FIG. 6A, at the processing stage following that of FIGS. 6A and 6B.

Referring to collectively to FIGS. 7A and 7B, a first dielectric liner material 151 may be formed over the microelectronic device structure 100, including inside the slots 112 (FIGS. 6A and 6B), the live contact openings 148A (FIG. 6A), and the support contact openings 148B (FIGS. 6A and 6B); a sacrificial fill material 152 may be formed within each of the slots 112 (FIGS. 6A and 6B), the live contact openings 148A (FIG. 6A), and the support contact openings 148B (FIGS. 6A and 6B); and then a planarization process (e.g., a CMP process) may be performed. The foregoing results in the formation of sacrificial slot structures 142, sacrificial live contact structures 150 (FIG. 7A), and support contact structures 154 (FIG. 7B) within the slots 112 (FIGS. 6A and 6B), the live contact openings 148A (FIG. 6A), and the support contact openings 148B (FIGS. 6A and 6B), respectively. As shown in FIGS. 7A and 7B, upper surfaces of the sacrificial slot structures 142, the sacrificial live contact structures 150, and the support contact structures 154 may be formed (e.g., through use of a planarization process, such as a CMP process) to be substantially coplanar with one another and upper surfaces of the preliminary stack structure 102.

In some embodiments first dielectric liner material 151 comprises a dielectric oxide material (e.g., $SiO_x$, such as $SiO_2$), and the sacrificial fill material 152 comprises polycrystalline silicon. In additional embodiments, the first dielectric liner material 151 comprises at least one different insulative material having etch selectivity relative to the sacrificial fill material 152 and the sacrificial material 106 of the tiers 108 of the preliminary stack structure 102. In further embodiments, the sacrificial fill material 152 comprises a different semiconductive material (a different semi-insulative material) and/or an insulative material.

Referring to FIG. 7A, the sacrificial slot structures 142 may individually include the sacrificial fill material 152, the first dielectric liner material 151, the sacrificial second liner 128, and the sacrificial first material 126. In addition, the sacrificial live contact structures 150 may also individually include the sacrificial fill material 152, the first dielectric liner material 151, the sacrificial second liner 128, and the sacrificial first material 126. The sacrificial slot structures 142 and the sacrificial live contact structures 150 may respectively subsequently be replaced with dielectric-filled slot structures and live contact structures, as described in further detail below with reference to FIGS. 8A through 8C.

Referring to FIG. 7B, the support contact structures 154 may individually be formed of and include the first dielectric liner material 151 and the sacrificial fill material 152. The support contact structures 154 may be maintained in a microelectronic device formed from the microelectronic device structure 100 following further processing, as described in further detail below. Maintaining the support contact structures 154, including the sacrificial fill material 152 thereof, may provide the microelectronic device structure 100 with desirable structural characteristics. For example, the support contact structures 154 may resist axial (X-Y) deflection and can impede undesirable bending of features (e.g., conductive contact structures, such as live contact structures to subsequently be formed) during and/or after subsequent processing to the microelectronic device structure 100. In some embodiments, the support contact structures 154 exhibit at least 1.5 times (e.g., at least 2 times, at least 5 times, at least 10 times) the resistance to axial deflection relative to live contact structures 158 (FIGS. 8A-8C) to subsequently be formed. Further, the support contact structures 154 may also be referred to as "dummy" contact structures 154.

Figure 8A:
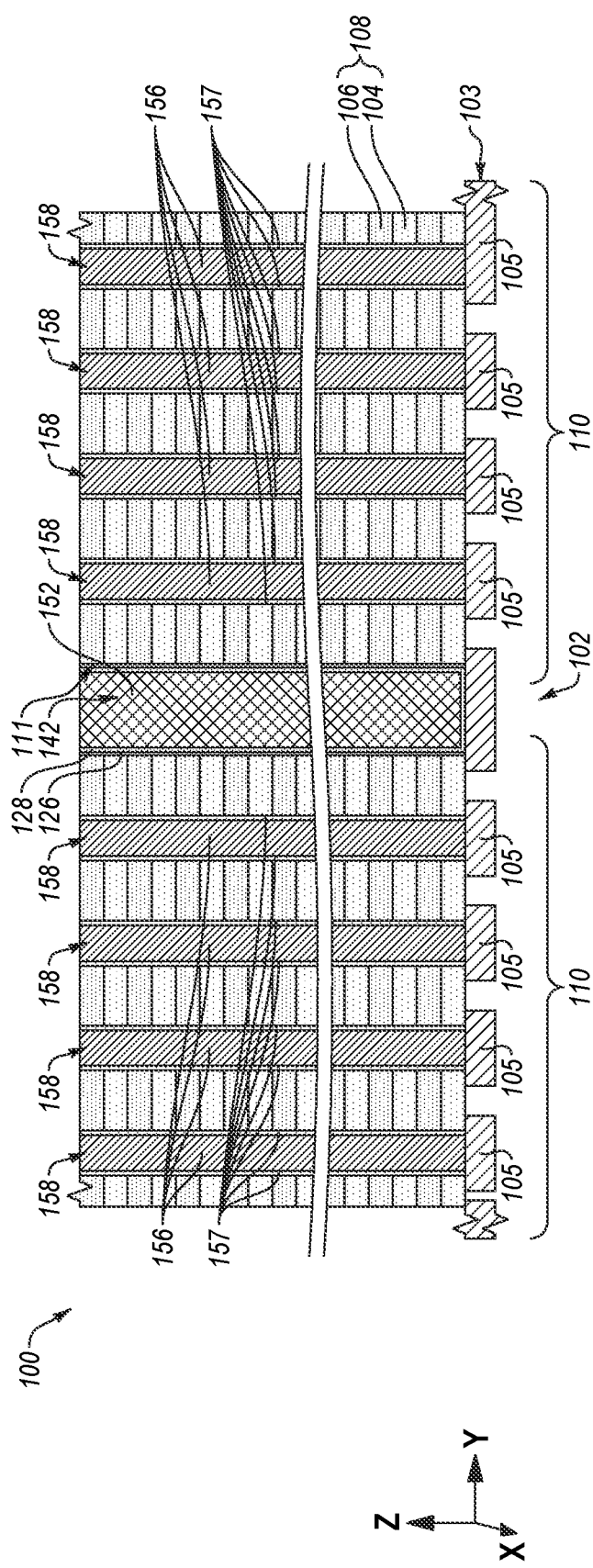
FIGS. 8A, 8B and 8C are simplified longitudinal cross-section elevation views of the portion of the microelectronic device structure shown in FIG. 7B following the processing stage of FIG. 7B.
Figure 8B:
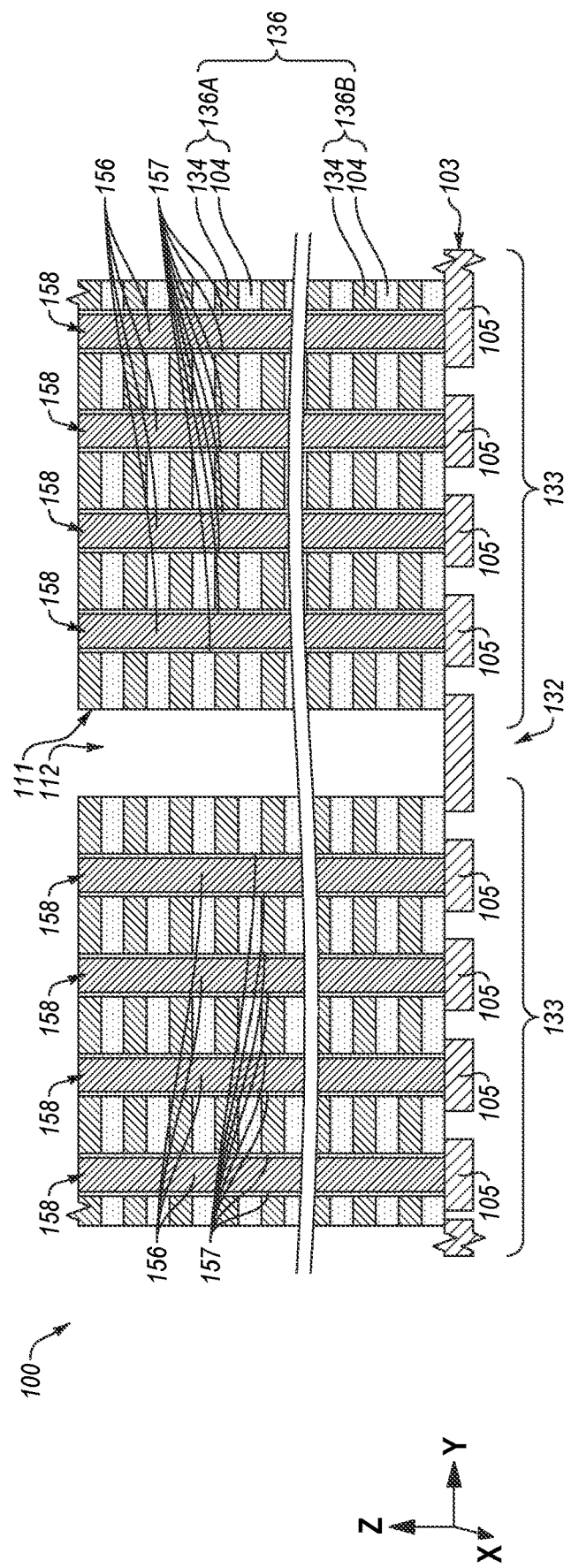
Figure 8C:
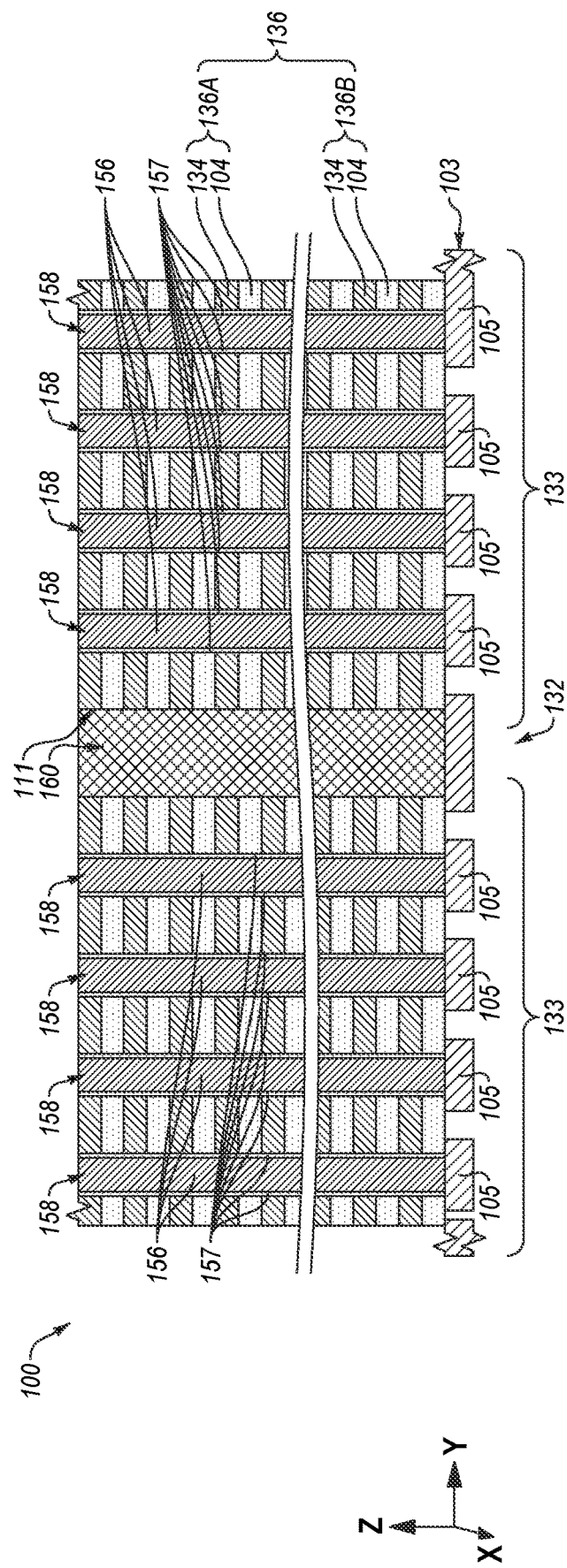

FIGS. 8A, 8B and 8C are longitudinal cross-sectional elevation views of a portion of the microelectronic device structure 100 at different processing stages following that of FIGS. 7A and 7B. The processing stages of FIGS. 8A, 8B, and 8C may be effectuated sequentially relative to one another. The views of each of FIGS. 8A, 8B and 8C are along the section line E-E shown in FIG. 6A.

Referring first to FIG. 8A, the sacrificial live contact structures 150 (FIG. 7A) may be removed and replaced with live contact structures 158. The live contact structures 158 may individually include conductive material 156 vertically extending through the preliminary stack structure 102, and a second dielectric liner material 157 horizontally surrounding the conductive material 156 and vertically extending through the preliminary stack structure 102. The second dielectric liner material 157 may separate the conductive material 156 from the insulative material 104 and the sacrificial material 106 of the tiers 108 of the preliminary stack structure 102. In some embodiments, the conductive material 156 is formed of and includes tungsten (W), and the second dielectric liner material 157 is formed of and includes dielectric oxide (e.g., $SiO_x$, such as $SiO_2$).

To form the live contact structures 158, the sacrificial fill material 152 (FIG. 7A) is exhumed (e.g., selectively etched). The first dielectric liner material 151 and the sacrificial second liner 128 may then be removed (e.g., etched), if the first dielectric liner material 151 and the sacrificial second liner 128 were not removed by material removal (e.g., etching) process employed to exhume the sacrificial fill material 152. In an embodiment, a first etching process is used to remove the sacrificial fill material 152 (FIG. 7A), the first dielectric liner material 151 (FIG. 7A) and the sacrificial second liner 128 (FIG. 7A), where the etch process stops on the sacrificial first material (FIG. 7A). Thereafter, a second etch process is used to the sacrificial first material 126 (FIG. 7A). The second etching process does not remove the insulative material 104 (FIG. 7A) nor the sacrificial material 106 (FIG. 7A) of the tiers 108 (FIG. 7A). In an embodiment, a wet nitride stripping (WNS) process is used after the second etching process to remove the sacrificial first material 126 (FIG. 7A) to remove residual sacrificial first liner 126 (FIG. 7A). After removal of the sacrificial live contact structures 150 (FIG. 7A), including the sacrificial fill material 152 (FIG. 7A), the first dielectric liner material 151 (FIG. 7A), the sacrificial second liner 128 (FIG. 7A), and the sacrificial first material 126 (FIG. 7A), the second dielectric liner material 157 may be formed, followed by formation of the conductive material 156 within remainders of the live contact openings 148 after forming the second dielectric liner materials 157. In an embodiment, the second dielectric liner material 157 comprises dielectric oxide, such as $SiO_x$ (e.g., $SiO_2$). A CMP process may be then be performed to form the live contact structures 158.

Next, referring to FIG. 8B, the sacrificial slot structures 142 (FIGS. 7A and 7B) may be removed from the slots 112 (FIGS. 7A and 7B) to expose surfaces of the insulative material 104 (FIGS. 7A and 7B) and the sacrificial material 106 (FIGS. 7A and 7B) of the tiers 108 (FIGS. 7A and 7B) of the preliminary stack structure 102 (FIGS. 7A and 7B), and then the preliminary stack structure 102 (FIGS. 7A and 7B) may be subjected to replacement gate processing to at least partially (e.g., substantially) replace the sacrificial material 106 (FIG. 8A) of the tiers 108 (FIG. 8A) of the preliminary stack structure 102 (FIG. 8A) with conductive material 134. The replacement gate processing may convert the preliminary stack structure 102 (e.g., FIG. 8A) including the preliminary blocks 110 (FIG. 8A) into a stack structure 132 including blocks 133. The stack structure 132 may include a vertically alternating (e.g., in the Z-direction) sequence of the insulative material 104 and the conductive material 134 arranged in tiers 136. The stack structure 132 may be divided into the blocks 133, and the shapes and dimensions of the blocks 133 may be substantially the same as the shapes and dimensions of the preliminary blocks 110 described with reference to FIG. 1A. The slots 112 may be interposed between horizontally neighboring (e.g., in the Y-direction) blocks 133 of the stack structure 132.

The conductive material 134 of the tiers 136 of the stack structure 132 may formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive material 134 is formed of and includes tungsten (W). Optionally, at least one liner material (e.g., at least one insulative liner material, at least one conductive liner materials) may be formed around the conductive material 134. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive material 134. In some embodiments, the liner material comprises titanium nitride ($TiN_x$, such as TiN). In further embodiments, the liner material further includes aluminum oxide (AlO$_x$, such as Al$_2$O$_3$). As a non-limiting example, for each of the tiers 136 of the stack structure 132, AlO$_x$ (e.g., Al$_2$O$_3$) may be formed directly adjacent the insulative material 104, TiN$_x$ (e.g., TiN) may be formed directly adjacent the AlO$_x$, and W may be formed directly adjacent the TiN$_x$. For clarity and ease of understanding the description, the liner material is not illustrated in FIG. 8B, but it will be understood that the liner material may be disposed around the conductive material 134.

Within each block 133 of the stack structure 132, the conductive material 134 of one or more relatively vertically higher tier(s) 136A (e.g., upper tiers) may be employed to form upper select gate structures (e.g., drain side select gate (SGD) structures) for upper select transistors (e.g., drain side select transistors) of the block 133, as described in further detail below. The conductive material 134 of relatively vertically higher tier(s) 136A may be segmented by one or more filled slot(s) (e.g., filled SGD slot(s)) to form the upper select gate structures of the block 133, as also described in further detail below. In some embodiments, within each block 133 of the stack structure 132, the conductive material 134 of each of less than or equal to eight (8) relatively higher tier(s) 136A (e.g., from one (1) relatively vertically higher tier 136A to eight (8) relatively vertically higher tiers 136A) of the stack structure 132 is employed to form upper select gate structures (e.g., SGD structures) for the block 133. In addition, within each block 133 of the stack structure 132, the conductive material 134 of at least some relatively vertically lower tiers 136B vertically underlying the relatively vertically higher tier(s) 136A may be employed to form access line structures (e.g., word line structures) of the block 133, as also described in further detail below. Moreover, within each block 133 of the stack structure 132, the conductive material 134 of at least a vertically lowest tier 136 may be employed to form as at least one lower select gate structure (e.g., at least one source side select gate (SGS) structure) for lower select transistors (e.g., source side select transistors) of the block 133, as also described in further detail below.

The replacement gate processing employed to form the stack structure 132 may include treating the microelectronic device structure 100 with at least one wet etchant formulated to selectively remove portions of the sacrificial material 106 (FIG. 8A) of the tiers 108 (FIG. 8A) of the preliminary stack structure 102 (FIG. 8A). The wet etchant may be selected to remove the portions of the sacrificial material 106 (FIG. 8A) without substantially removing portions of the insulative material 104 of the tiers 108 (FIG. 8A) of the preliminary stack structure 102 (FIG. 8A). In some embodiments wherein the sacrificial material 106 (FIG. 8A) comprises a dielectric nitride material (e.g., SiN$_y$, such as Si$_3$N$_4$) and the insulative material 104 comprise a dielectric oxide material (e.g., SiO$_x$, such as SiO$_2$), the sacrificial material 106 (FIG. 8A) of the tiers 108 (FIG. 8A) of the preliminary stack structure 102 (FIG. 8A) is selectively removed using a wet etchant comprising H$_3$PO$_4$. Following the selective removal of the portions of the sacrificial material 106 (FIG. 8A), the resulting recesses may be filled with the conductive material 134 to form the stack structure 132 (including the tiers 136 and the blocks 133 thereof). In addition, following the formation of the stack structure 132, the sacrificial slot structures 142 (FIG. 8A) between the blocks 133 of the stack structure 132 may be filled with dielectric material to form dielectric-filled slot structures 160 (as described in further detail below with reference to FIG. 8C) horizontally interposed between horizontally neighboring blocks 133 of the stack structure 132. By comparison between the first dielectric liner material 151 and the polysilicon fill material 152 that comprise the support contact structures 154 (FIG. 7B), and the second dielectric liner material 157 and the conductive material 156 that comprise the live contact structures 158 (FIG. 8B), the first dielectric liner material 151 contacts the source tier 103 and the first dielectric liner material 151 is between the polysilicon fill material 152 and the source tier 103 (FIG. 7B), but the second dielectric liner material 157 contacts the source tier 103 and the second dielectric liner material 157 is adjacent the conductive material 156, which also contacts the source tier 103 (FIG. 8B).

Referring next to FIG. 8C, following the formation of the stack structure 132, the slots 112 (FIG. 8B) have been filled with additional dielectric material to form filled slot structures 160. The filled slot structures 160 (e.g., dielectric-filled slot structures 160) horizontally neighbor the blocks 133 in the Y-direction. In some embodiments, the slots 112 (FIG. 8B) are filled with dielectric oxide material (e.g., SiO$_x$, such as SiO$_2$) to form the filled slot structures 160.

Microelectronic device structures (e.g., the microelectronic device structure 100 following the processing stage described with reference to FIG. 8C) may be included in microelectronic devices of the disclosure. For example, FIG. 9 illustrates a partial cutaway perspective view of a portion of a microelectronic device 101 (e.g., a memory device, such as a 3D NAND Flash memory device) including a microelectronic device structure of the disclosure (e.g., the microelectronic device structure 100 (FIG. 8C)).

The microelectronic device 101 includes the microelectronic device structure 100 following the processing stage previously described with reference to FIG. 8C. For example, the microelectronic device structure 100 of the microelectronic device 101 includes the stack structure 132 and includes, without limitation, the blocks 133 separated by the filled slot structures 160; the source tier 103 underlying the stack structure 132; and contact structures 159 including the live contact structures 158 and the support contact structures 154 vertically extending through the stack structure 132 within horizontal areas of one or more crest regions 122 of the blocks 133 of the stack structure 132. Further, additional conductive contact structures 162, which may be referred to as step contact structures, may be positioned upon the steps 118 of one or more staircase structures 116 of one or more stadium structures 114 of the blocks 133 of the stack structure 132. Further, live contact structures 158 may also be within the staircase structures 116, although they may not have any support contact structures (e.g., support contact structures 154) that are laterally proximate live contact structures 158, by comparison to the live contact structures 158 that are laterally proximate support contact structures 154 within the crest regions 122.

Figure 9:
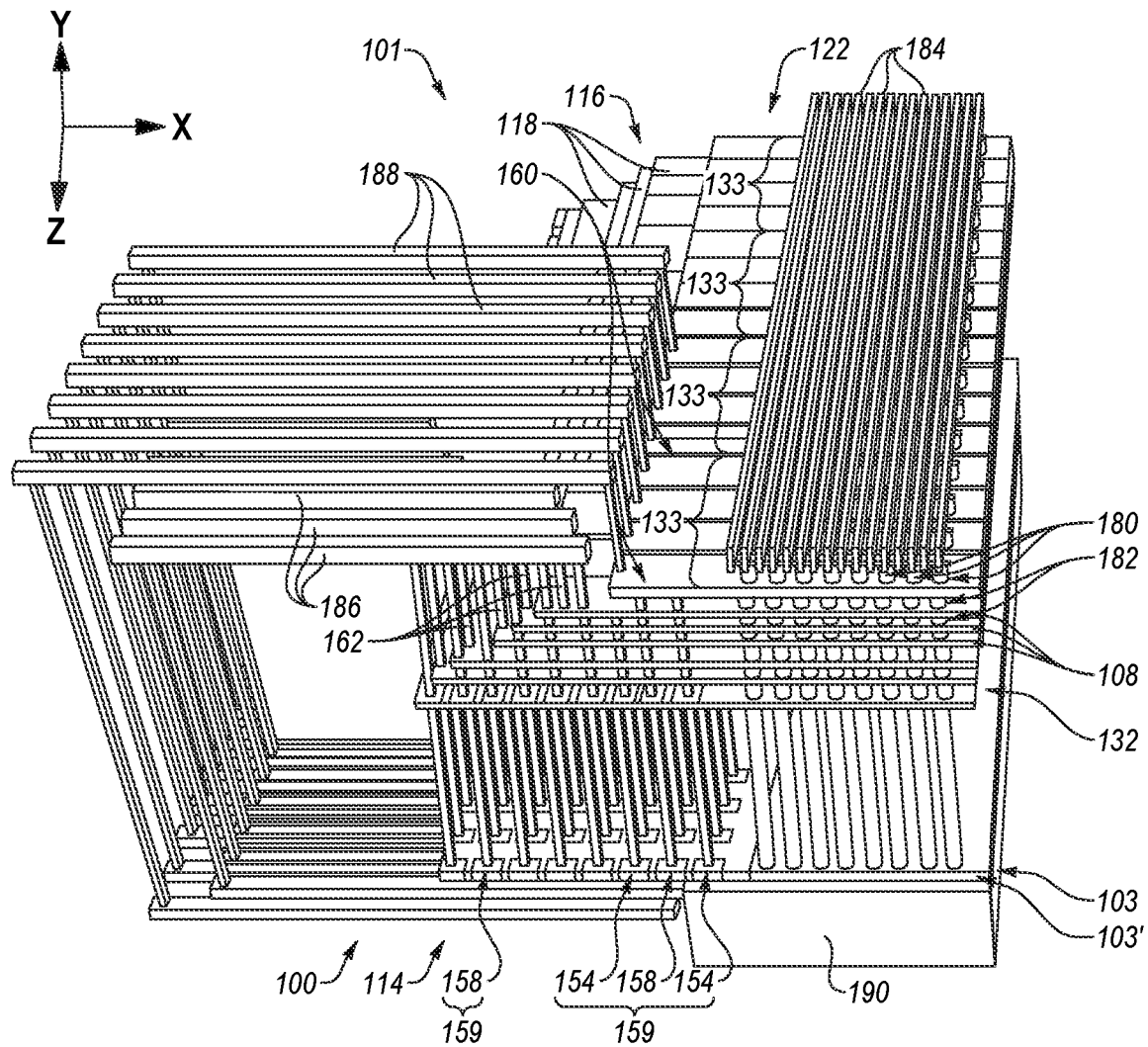
FIG. 9 illustrates a partial cutaway perspective view of a portion of a microelectronic device, according to embodiments of disclosure.

As shown in FIG. 9, the microelectronic device 101 may further include strings 180 of memory cells 182 vertically coupled to each other in series, data lines 184 (e.g., bit lines), access lines 186, and select lines 188. The strings 180 of the memory cells 182 extend vertically and orthogonally to conductive lines and tiers (e.g., the data lines 184, the source tier 103, the tiers 136 (FIG. 8C) of the stack structure 132, the access lines 186, the select lines 188) of the microelectronic device 101, and the additional conductive contact structures 162 may couple components to each other as shown (e.g., the access lines 186 and the select lines 188 to the tiers 136 of the stack structure 132) of the microelectronic device structure 100.

With continued reference to FIG. 9, the microelectronic device 101 may also include a control unit 190 (e.g., a control device) positioned vertically below the strings 180 of memory cells 182, which may include one or more of string driver circuitry, pass gates, circuitry for selecting gates, circuitry for selecting conductive lines (e.g., the data lines 184, the access lines 186, the select lines 188, additional data lines, additional access lines, additional select lines), circuitry for amplifying signals, and circuitry for sensing signals. The circuitry of the control unit 190 may, for example, be coupled to the data lines 184, a source structure 103' of the source tier 103, the access lines 186, and select lines 188. In some embodiments, the control unit 190 includes CMOS (complementary metal-oxide-semiconductor) circuitry. In such embodiments, the control unit 190 may be characterized as having a "CMOS under Array" ("CuA") configuration.

Figure 10:
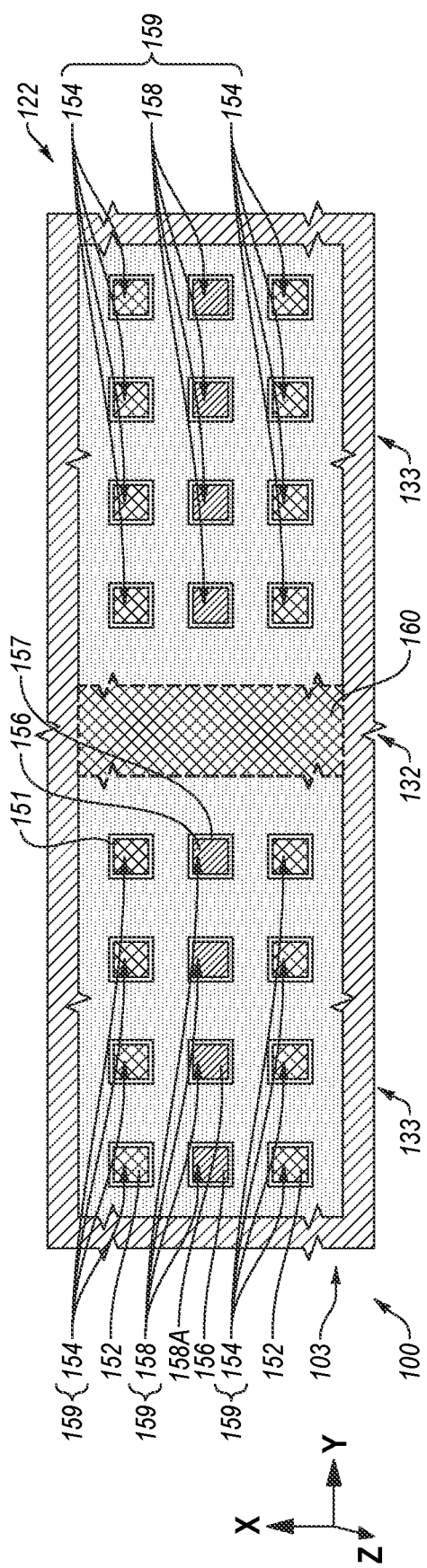

FIGS. 10, 11, 12 and 13 illustrate different simplified, partial top-down views of microelectronic device structures 100, 200, 300, and 400, respectively. The portions of the microelectronic device structures 100, 200, 300, 400 shown in FIGS. 10, 11, 12 and 13 correspond to the portion C (FIGS. 1C, 2A, 3A, 4A, 5A, 6A) of the microelectronic device structure 100 previously described herein. The microelectronic device structure 100 depicted in FIG. 10 corresponds to the microelectronic device structure 100 following the processing stage previously described with reference to FIG. 8C, as has already been described herein. The microelectronic device structures 200, 300, and 400 respectively illustrate different arrangements of the contact structures 159, including the live contact structures 158 and the support contact structures 154 that may be provided in place of or in combination with the arrangements of the contact structures 159 depicted in FIG. 10. Any of the microelectronic device structures 200, 300, and 400 may be provided in place of or in combination with the microelectronic device structures 100 within the microelectronic device 101 (FIG. 9). FIG. 10 illustrates the microelectronic device structure 100 including alternating rows (Y-direction) of live contact structures 158 and support contact structures 154. Attention is directed to the left-of center live contact structure 158, which is indicated with reference number 158A for the location, and it may be referred to as "centrally located." In this embodiment, the live contact structure 158A is centrally located laterally proximate two (2) other live contact structures 158, and six (6) support contact structures 154. The live contact structure 158A may be horizontally interposed between two (2) other live contact structures 158 in the Y-direction, and may be horizontally interposed between two (2) support contact structures 154 in the X-direction.

Figure 11:
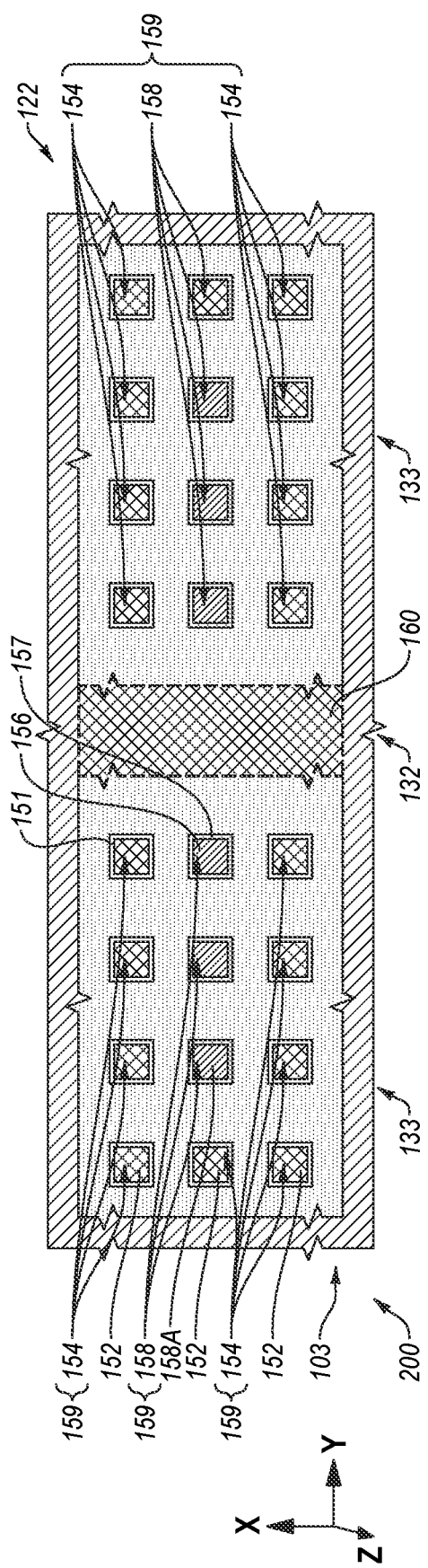

FIG. 11 illustrates a microelectronic device structure 200 having a different arrangement of live contact structures 158 and support contact structures 154 than the microelectronic device structure 100 (FIG. 10), in accordance with embodiments of the disclosure. Attention is directed to the left-of center live contact structure 158, which structure is indicated with reference number 158A for the location, and it may be referred to as "centrally located." In this embodiment, the live contact structure 158A is centrally located laterally proximate one (1) other live contact structure 158, and seven (7) support contact structures 154. The live contact structure 158A may be horizontally interposed between one (1) other live contact structure 158 and one support contact structure 154 in the Y-direction, and may be horizontally interposed between two (2) support contact structures 154 in the X-direction.

FIG. 12 illustrates a microelectronic device structure 300 having another different arrangement of live contact structures 158 and support contact structures 154 than the microelectronic device structure 100 (FIG. 10), in accordance with embodiments of the disclosure. Attention is directed to the left-of center live contact structure 158, which structure is indicated with reference number 158A for the location, and it may be referred to as "centrally located." In this embodiment, the live contact structure 158A is centrally located laterally proximate three (3) other live contact structures 158, and five (5) support contact structures 154. The live contact structure 158A may be horizontally interposed between one (1) other live contact structure 158 and one support contact structure 154 in the Y-direction, and may be horizontally interposed between two (2) support contact structures 154 in the X-direction.

FIG. 13 illustrates a microelectronic device structure 400 having yet another different arrangement of live contact structures 158 and support contact structures 154 than the microelectronic device structure 100 (FIG. 10), in accordance with embodiments of the disclosure. Attention is directed to the left-of center live contact structure 158, which structure is indicated with reference number 158A for the location, and it may be referred to as "centrally located." In this embodiment, the live contact structure 158A is centrally located laterally proximate four (4) other live contact structures 158, and four (4) support contact structures 154. The live contact structure 158A may be horizontally interposed between two (2) support contact structures 154 in the Y-direction, and may be horizontally interposed between other two (2) support contact structures 154 in the X-direction.

Figure 14:
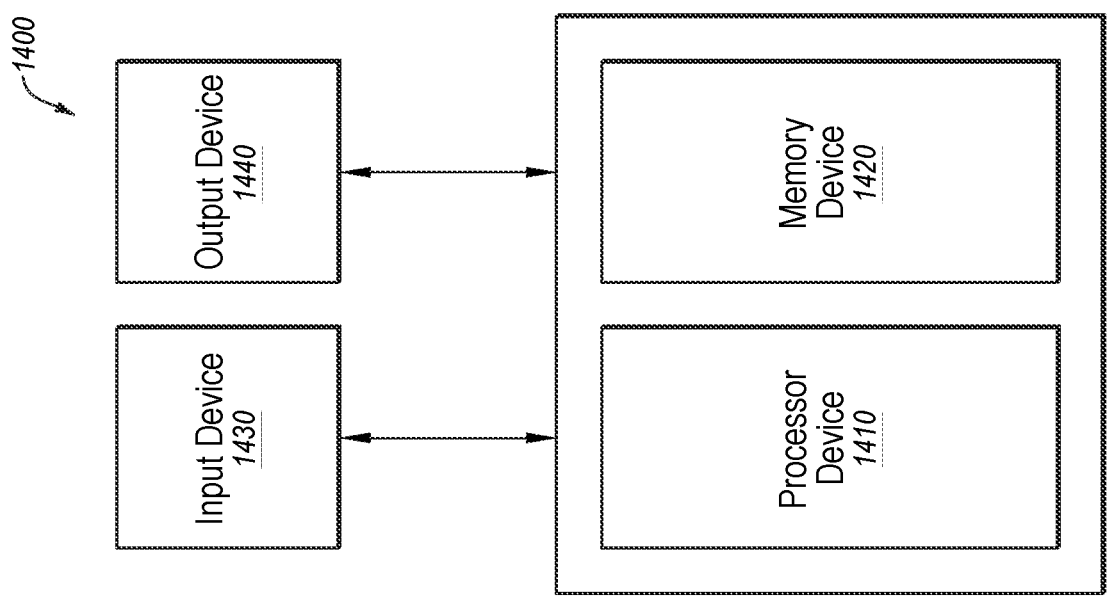
FIG. 14 is a block diagram of an electronic system, according to embodiments of disclosure.

Microelectronic devices such as (the microelectronic device 101 (FIG. 9)) of the disclosure may be included in embodiments of electronic systems of the disclosure. For example, FIG. 14 is a block diagram of an electronic system 1400, according to embodiments of disclosure. The electronic system 1400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 1400 includes at least one memory device 1420. The memory device 1420 may include, for example, one or more of microelectronic devices (e.g., the microelectronic device 101 (FIG. 9)) and microelectronic device structures (e.g., the microelectronic device structures 100 (FIG. 10), 200 (FIG. 11), 300 (FIG. 12) and 400 (FIG. 13)) of the disclosure. The electronic system 1400 may further include at least one electronic signal processor device 1410 (often referred to as a "microprocessor") that is part of an integrated circuit. The electronic signal processor device 1410 may include, for example, one or more of microelectronic devices (e.g., the microelectronic device 101 (FIG. 9)) and microelectronic device structures (e.g., the microelectronic device structures 100 (FIG. 10), 200 (FIG. 11), 300 (FIG. 12) and 400 (FIG. 13)) of the disclosure. While the memory device 1420 and the electronic signal processor device 1410 are depicted as two (2) separate devices in FIG. 14, in additional embodiments, a single (e.g., only one) memory/processor device having the functionalities of the memory device 1420 and the electronic signal processor device 1410 is included in the electronic system 1400. In such embodiments, the memory/processor device may include, for example, one or more of microelectronic device (e.g., the microelectronic device 101 (FIG. 9)) and microelectronic device structures (e.g., the microelectronic device structures 100 (FIG. 10), 200 (FIG. 11), 300 (FIG. 12) and 400 (FIG. 13)) of the disclosure. The electronic signal processor device 1410 and the memory device 1420 may be part of a disaggregated-die assembly 1410 and 1420.

The electronic system 1400 may further include one or more input devices 1430 for inputting information into the electronic system 1400 by a user, such as, for example, a mouse or other pointing device, a keyboard, a touchpad, a button, or a control panel. The electronic system 1400 may further include one or more output devices 1440 for outputting information (e.g., visual or audio output) to a user such as, for example, a monitor, a display, a printer, an audio output jack, and/or a speaker. In some embodiments, the input device 1430 and the output device 1440 may comprise a single touchscreen device that can be used both to input information to the electronic system 1400 and to output visual information to a user. The input device 1430 and the output device 1440 may communicate electrically with one or more of the memory device 1420 and the electronic signal processor device 1410. Thus, disclosed is a method of forming a microelectronic device, comprising forming a preliminary stack structure comprising blocks separated by slots, each of the blocks comprising: tiers each comprising insulative material and sacrificial material vertically adjacent the insulative material; and contact openings vertically extending completely through the tiers to a source tier, the contact openings comprising live contact openings and support contact openings; forming, in sequence, a sacrificial first liner and a sacrificial second liner over surfaces of the preliminary stack structure, including over the preliminary blocks, within the slots, and within the contact openings; removing portions of the sacrificial second liner and the sacrificial first liner within the support contact openings without removing additional portions of the sacrificial second liner and the sacrificial first liner within the slots and the live contact openings; forming sacrificial fill material within remaining portions of the slots, the live contact openings, and the support contact openings to form sacrificial slot structures, sacrificial live contact structures, and support contact structures, respectively; replacing the sacrificial live contact structures with conductive, live contact structures; removing the sacrificial slot structures to expose side surfaces of the tiers; and replacing the sacrificial material of the tiers with conductive material after removing the sacrificial slot structures.

Thus, also disclosed is microelectronic device, comprising a stack structure comprising a vertically alternating sequence of conductive material and insulative material arranged in tiers, the stack structure divided into blocks separated from one another by dielectric-filled slot structures, at least one of the blocks comprising staircase structures having steps comprising horizontal ends of at least some of the tiers of the stack structure; crest regions horizontally interposed between horizontally neighboring pairs of the staircase structures; and bridge regions horizontally interposed between staircase structures and the dielectric-filled slot structures, the bridge regions horizontally extending from and between the crest regions; and contact structures extending through the tiers, the contact structures comprising live contact structures within the crest regions of the blocks, the conductive contact structures comprising conductive material extending through the tiers of the stack structure and to a source tier; and support contact structures within the crest regions of the blocks, the support contact structures comprising polycrystalline silicon material extending through the tiers of the stack structure.

Thus, also disclosed is a memory device, comprising a stack structure comprising a vertically alternating sequence of conductive material and insulative material arranged in tiers, the stack structure divided into blocks separated from one another by dielectric-filled slot structures, each of the blocks comprising stadium structures individually comprising staircase structures having steps comprising horizontal ends of the tiers; crest regions interposed between neighboring pairs of the stadium structures in a first horizontal direction; bridge regions interposed between the stadium structures and the dielectric-filled slot structures in a second horizontal direction orthogonal to the first horizontal direction; and array regions comprising vertically extending strings of memory cells; a source tier underlying the stack structure and comprising at least one source structure in electrically communication with the vertically extending strings of memory cells; data lines overlying the stack structure and in electrical communication with the vertically extending strings of memory cells; first contact structures within the crest regions of the blocks and individually including conductive material vertically extending through the tiers and to the source tier; and second contact structures neighboring the first contact structures within the crest regions of the blocks and individually including polycrystalline silicon material extending through the tiers and to the source tier; conductive contact structures on at least some of the steps of stadium structures of the blocks; conductive routing structures in electrical communication with at least some of the conductive contact structures and at least some of the first contact structures; and a control device in electrical communication with the data lines, at least one the source structure, and the first contact structures. Thus, also disclosed is an electronic system, comprising an input device; an output device; a processor device operably coupled to the input device and the output device; and a memory device operably coupled to the processor device and comprising at least one microelectronic device structure comprising a stack structure comprising a vertically alternating sequence of conductive material and insulative material arranged in tiers, each of the tiers individually comprising some of the conductive material vertically neighboring some of the insulative material, and the stack structure divided into blocks separated from one another by dielectric-filled slot structures; contact structures extending through the tiers and comprising live contact structures comprising conductive fill material; and support contact structures comprising polysilicon fill material; staircase structures within the blocks of the stack structure, each of the staircase structures having steps comprising horizontal ends of at least some of the tiers of the stack structure; crest regions within the blocks of the stack structure and horizontally interposed between horizontally neighboring pairs of the staircase structures, at least some of the live contact structures and the support contact structures within horizontal areas of the crest regions; bridge regions within the blocks of the stack structure and horizontally interposed between staircase structures and the dielectric-filled slot structures, the bridge regions horizontally extending from and between the crest regions.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising a vertically alternating sequence of conductive material and insulative material arranged in tiers, the stack structure divided into blocks separated from one another by dielectric-filled slot structures, at least one of the blocks comprising:
staircase structures having steps comprising horizontal ends of at least some of the tiers of the stack structure;
crest regions horizontally interposed between horizontally neighboring pairs of the staircase structures; and
bridge regions horizontally interposed between staircase structures and the dielectric-filled slot structures, the bridge regions horizontally extending from and between the crest regions; and
contact structures extending through the tiers, the contact structures comprising:
live contact structures within the crest regions of the blocks, the contact structures comprising conductive material extending through the tiers of the stack structure and to a source tier; and
support contact structures within the crest regions of the blocks, the support contact structures comprising polycrystalline silicon material extending through the tiers of the stack structure.

2. The microelectronic device of claim 1, wherein:
the support contact structures further comprise a first dielectric liner material surrounding the polycrystalline silicon material; and
the live contact structures further comprise a second dielectric liner material surrounding the conductive material.

3. The microelectronic device of claim 2, wherein portions of the first dielectric liner material are vertically interposed between the polycrystalline silicon fill material and the source tier.

4. The microelectronic device of claim 1, wherein the conductive material of each of the live contact structures physically contacts at least one conductive structure within the source tier.

5. The microelectronic device of claim 1, wherein the live contact structures are coupled to metallization within the source tier, and wherein the support contact structures are insulated from the metallization within the source tier.

6. The microelectronic device of claim 1, further comprising conductive contact structures on the steps of the staircase structures.

7. The microelectronic device of claim 1, wherein the source tier comprises conductive structures under the stack structure.

8. The microelectronic device of claim 1, wherein the live contact structures are substantially confined within horizontal areas of the crest regions.

9. A memory device, comprising:
a stack structure comprising a vertically alternating sequence of conductive material and insulative material arranged in tiers, the stack structure divided into blocks separated from one another by dielectric-filled slot structures, each of the blocks comprising:
stadium structures individually comprising staircase structures having steps comprising horizontal ends of the tiers;
crest regions interposed between neighboring pairs of the stadium structures in a first horizontal direction;
bridge regions interposed between the stadium structures and the dielectric-filled slot structures in a second horizontal direction orthogonal to the first horizontal direction; and
array regions comprising vertically extending strings of memory cells;
a source tier underlying the stack structure and comprising at least one source structure in electrically communication with the vertically extending strings of memory cells;
data lines overlying the stack structure and in electrical communication with the vertically extending strings of memory cells;
first contact structures within the crest regions of the blocks and individually including conductive material vertically extending through the tiers and to the source tier; and
second contact structures neighboring the first contact structures within the crest regions of the blocks and individually including polycrystalline silicon material extending through the tiers and to the source tier;
conductive contact structures on at least some of the steps of stadium structures of the blocks;
conductive routing structures lines in electrical communication with at least some of the conductive contact structures and at least some of the first contact structures; and
a control device in electrical communication with the data lines, at least one the source structure, and the first contact structures.

10. The memory device of claim 9, further comprising dielectric liner material horizontally interposed between the polycrystalline silicon of the second contact structures and the conductive material of the tiers of the stack structure.

11. The memory device of claim 9, wherein the control device comprises complementary metal-oxide-semiconductor (CMOS) circuitry.

12. An electronic system, comprising:
an input device;
an output device;
a processor device operably coupled to the input device and the output device; and
a memory device operably coupled to the processor device and comprising at least one microelectronic device structure comprising:
a stack structure comprising a vertically alternating sequence of conductive material and insulative material arranged in tiers, each of the tiers individually comprising some of the conductive material vertically neighboring some of the insulative material, and the stack structure divided into blocks separated from one another by dielectric-filled slot structures; and
contact structures extending through the tiers and comprising:
live contact structures comprising conductive fill material; and
support contact structures comprising polysilicon fill material;
staircase structures within the blocks of the stack structure, each of the staircase structures having steps comprising horizontal ends of at least some of the tiers of the stack structure;
crest regions within the blocks of the stack structure and horizontally interposed between horizontally neighboring pairs of the staircase structures, at least some of the live contact structures and the support contact structures within horizontal areas of the crest regions; and bridge regions within the blocks of the stack structure and horizontally interposed between staircase structures and the dielectric-filled slot structures, the bridge regions horizontally extending from and between the crest regions.

13. The electronic system of claim 12, wherein the memory device further comprises array regions within the blocks and each horizontally neighboring at least one of the crest regions, the array regions individually including strings of memory cells vertically extending through the tiers of stack structure.

* * * * *